(12) United States Patent
Mochizuki et al.

(10) Patent No.: US 11,385,043 B2
(45) Date of Patent: Jul. 12, 2022

(54) ANGLE SENSOR AND DETECTION DEVICE

(71) Applicant: TDK CORPORATION, Tokyo (JP)

(72) Inventors: Shinichirou Mochizuki, Tokyo (JP); Masanori Sakai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 214 days.

(21) Appl. No.: 16/729,558

(22) Filed: Dec. 30, 2019

(65) Prior Publication Data
US 2020/0300602 A1    Sep. 24, 2020

(30) Foreign Application Priority Data

Mar. 19, 2019    (JP) .............................. JP2019-050708

(51) Int. Cl.
| | | |
|---|---|---|
| *G01B 7/30* | (2006.01) | |
| *G01D 5/14* | (2006.01) | |
| *H03M 3/00* | (2006.01) | |
| *G01D 5/16* | (2006.01) | |

(52) U.S. Cl.
CPC ............... *G01B 7/30* (2013.01); *G01D 5/145* (2013.01); *G01D 5/16* (2013.01); *H03M 3/422* (2013.01); *H03M 3/464* (2013.01); *H03M 3/496* (2013.01)

(58) Field of Classification Search
CPC .................................. G01B 7/30; G01D 5/145
See application file for complete search history.

(56) References Cited

U.S. PATENT DOCUMENTS

| | | | |
|---|---|---|---|
| 2008/0116886 A1 | 5/2008 | Yamada et al. | |
| 2012/0038359 A1* | 2/2012 | Saruki ................. | G01R 33/093 324/252 |
| 2016/0084938 A1 | 3/2016 | Doi et al. | |
| 2017/0370747 A1 | 12/2017 | Uchida et al. | |
| 2018/0087927 A1 | 3/2018 | Anagawa et al. | |
| 2018/0106903 A1 | 4/2018 | Iida et al. | |
| 2018/0116722 A1* | 5/2018 | Koyrakh ................ | A61B 34/20 |
| 2018/0164127 A1 | 6/2018 | Anagawa et al. | |
| 2019/0204063 A1* | 7/2019 | Ausserlechner ......... | G01D 5/16 |

FOREIGN PATENT DOCUMENTS

| | | |
|---|---|---|
| CN | 202033050 U | 11/2011 |
| JP | H06-311037 A | 11/1994 |
| JP | H07-139967 A | 6/1995 |
| JP | 2015-125127 A | 7/2015 |
| JP | 2017-227578 A | 12/2017 |

OTHER PUBLICATIONS

Translation of Feb. 16, 2021 Office Action issued in Japanese Patent Application No. 2019-050708.
Translation of Aug. 27, 2021 Office Action issued in Chinese Patent Application No. 202010189899.1.

* cited by examiner

*Primary Examiner* — Reena Aurora
(74) *Attorney, Agent, or Firm* — Oliff PLC

(57) ABSTRACT

An angle sensor includes a first magnetic sensor and a second magnetic sensor. The first magnetic sensor includes first and second detectors, and first and second analog-to-digital converters for converting analog detection signals generated by the first and second detectors into digital detection signals. The second magnetic sensor includes third and fourth detectors, and third and fourth analog-to-digital converters for converting analog detection signals generated by the third and fourth detectors into digital detection signals. The first to fourth analog-to-digital converters perform sampling at the same sampling time.

29 Claims, 17 Drawing Sheets

ANGLE SENSOR AND DETECTION DEVICE

BACKGROUND OF THE INVENTION

1. Field of the Invention

The present invention relates to an angle sensor for generating a detection value having a correspondence with an angle to be detected, and to a detection device for detecting physical information that varies depending on information to be detected and thereby generating a detection value having a correspondence with the information to be detected.

2. Description of the Related Art

In recent years, angle sensors have been widely used in various applications, such as detection of the rotational position of a steering wheel or a power steering motor in an automobile. The angle sensors generate a detection value having a correspondence with an angle to be detected. Examples of the angle sensors include a magnetic angle sensor. An angle sensor system using a magnetic angle sensor is typically provided with a magnetic field generator for generating a target magnetic field, which is a magnetic field to be detected by the magnetic angle sensor and whose direction rotates in response to the rotation or linear movement of an object. The magnetic field generator is a magnet, for example. The magnetic angle sensor detects the target magnetic field and generates a detection value. The angle to be detected by the magnetic angle sensor has a correspondence with an angle that the direction of the target magnetic field at a reference position forms with respect to a reference direction.

A type of magnetic angle sensor is known that includes a plurality of magnetic sensors and a processor for generating the detection value by performing arithmetic processing using detection data from the plurality of magnetic sensors. Such an angle sensor is disclosed in, for example, US2018/0087927A1. The angle sensor disclosed in US2018/0087927A1 includes a plurality of composite magnetic field information generation units, which correspond to the aforementioned plurality of magnetic sensors, and an angle computing unit, which corresponds to the aforementioned processor. The plurality of composite magnetic field information generation units, i.e., the magnetic sensors, and the angle computing unit, i.e., the processor, are provided in order to reduce error that occurs in the detection value due to a noise magnetic field.

US2016/0084938A1 discloses a location estimation system including a plurality of signal detection apparatuses. Each signal detection apparatus includes: a sensor for detecting a signal and outputting an electric signal; an analog-to-digital converter (ADC) for converting the electric signal from the sensor into a digital signal; a buffer on which the digital signal from the ADC is written; and a synchronization clock. An example of the signal detected by the sensor is a physical vibration such as an acoustic wave or another wave. The synchronization clock provides time information to the buffer. In accordance with the time information, operations of writing and reading on/from the buffer are performed. The time information of the synchronization clock is in synchronism with that of another synchronization clock incorporated in another signal detection apparatus.

In the case of the foregoing angle sensor including a plurality of magnetic sensors and a processor, the target magnetic field that the magnetic sensors detect temporally varies in direction. Such an angle sensor has a problem that an error occurs in the detection value if the magnetic sensors detect the target magnetic field at different timings. A similar problem applies to any detection apparatus that detects temporally-changing physical information by using a plurality of sensors and generates a detection value by performing arithmetic processing using the detection data from the plurality of sensors.

SUMMARY OF THE INVENTION

It is a first object of the present invention to provide an angle sensor that generates a detection value by performing arithmetic processing using detection data from a plurality of magnetic sensors, the angle sensor being capable of preventing error from occurring in the detection value due to a difference between the plurality of magnetic sensors in timing of detection of a target magnetic field.

It is a second object of the present invention to provide a detection device that generates a detection value by performing arithmetic processing using detection data from a plurality of magnetic sensors, the detection device being capable of preventing error from occurring in the detection value due to a difference between the plurality of magnetic sensors in timing of detection of a target magnetic field.

An angle sensor of the present invention is configured to detect a target magnetic field, which is a magnetic field whose direction varies depending on an angle to be detected, and to generate a detection value having a correspondence with the angle to be detected. The angle sensor of the present invention includes a plurality of magnetic sensors each of which generates detection data having a correspondence with the angle to be detected, and a processor that generates the detection value by performing arithmetic processing using a plurality of detection data generated by the plurality of magnetic sensors.

Each of the plurality of magnetic sensors includes at least one detector that detects the target magnetic field and generates at least one analog detection signal having a correspondence with the angle to be detected, and at least one analog-to-digital converter that samples the at least one analog detection signal generated by the at least one detector, converts the sampled at least one analog detection signal into at least one digital detection signal and outputs the at least one digital detection signal. In each of the plurality of magnetic sensors, the detection data is based on the at least one digital detection signal. The analog-to-digital converters in the plurality of magnetic sensors perform sampling at the same sampling time.

The angle sensor of the present invention may further include a plurality of electronic components. The plurality of magnetic sensors may be respectively included in different ones of the plurality of electronic components.

The angle sensor of the present invention may further include a clock generator that generates a sampling clock for determining the sampling time. In such a case, the analog-to-digital converters in the plurality of magnetic sensors may all be configured so that the sampling time is determined by the sampling clock generated by the clock generator.

When the angle sensor of the present invention includes the clock generator, the angle sensor may further include a plurality of electronic components, and the plurality of magnetic sensors may be respectively included in different ones of the plurality of electronic components. In such a case, the clock generator may be included in one of the plurality of electronic components or may be constructed separately from the plurality of electronic components.

When the angle sensor of the present invention includes the clock generator, the analog-to-digital converter may include a sample-and-hold circuit that samples the analog detection signal and a quantization circuit that quantizes an output signal of the sample-and-hold circuit. In such a case, the sample-and-hold circuit may be configured to alternate between a follow-up mode in which the output signal follows the analog detection signal and a holding mode in which the output signal is held at a constant value. The sampling time of the analog-to-digital converter may be a time at which the sample-and-hold circuit switches from the follow-up mode to the holding mode.

When the angle sensor of the present invention includes the clock generator, the analog-to-digital converter may include a quantization circuit that samples and quantizes the analog detection signal at the same time. In such a case, the sampling time of the analog-to-digital converter may be a time at which the quantization circuit samples and quantizes the analog detection signal.

In the angle sensor of the present invention, the plurality of magnetic sensors may be configured to detect the target magnetic field at mutually different detection positions.

In the angle sensor of the present invention, the plurality of magnetic sensors may be configured to detect an applied magnetic field at mutually different detection positions, the applied magnetic field being a composite magnetic field of the target magnetic field and a noise magnetic field other than the target magnetic field. In such a case, the processor may generate the detection value by performing arithmetic processing using the plurality of detection data so that the detection value contains reduced error caused by the noise magnetic field as compared to the case of generating the detection value based on any single one of the plurality of detection data.

When the plurality of magnetic sensors are configured to detected the foregoing applied magnetic field, the plurality of magnetic sensors may be a first magnetic sensor and a second magnetic sensor. The first magnetic sensor generates first detection data by detecting, at a first detection position, a first applied magnetic field including the target magnetic field. The second magnetic sensor generates second detection data by detecting, at a second detection position, a second applied magnetic field including the target magnetic field. The target magnetic field may have a first strength at the first detection position and a second strength at the second detection position, the first strength and the second strength being different from each other.

The first detection data may indicate a first angle that the direction of a first applied magnetic field component forms with respect to a reference direction, the first applied magnetic field component being a component of the first applied magnetic field and being parallel to a first reference plane. The second detection data may indicate a second angle that the direction of a second applied magnetic field component forms with respect to the reference direction, the second applied magnetic field component being a component of the second applied magnetic field and being parallel to a second reference plane. The processor may generate the detection value by performing arithmetic processing using the first and second angles and the ratio of the first strength to the second strength of the target magnetic field.

The first magnetic sensor may include a first detector and a second detector as the at least one detector, and a first analog-to-digital converter and a second analog-to-digital converter as the at least one analog-to-digital converter. The first detector may generate a first analog detection signal having a correspondence with the cosine of the first angle. The second detector may generate a second analog detection signal having a correspondence with the sine of the first angle. The first and second analog-to-digital converters convert the first and second analog detection signals into first and second digital detection signals, respectively. The second magnetic sensor may include a third detector and a fourth detector as the at least one detector, and a third analog-to-digital converter and a fourth analog-to-digital converter as the at least one analog-to-digital converter. The third detector may generate a third analog detection signal having a correspondence with the cosine of the second angle. The fourth detector may generate a fourth analog detection signal having a correspondence with the sine of the second angle. The third and fourth analog-to-digital converters convert the third and fourth analog detection signals into third and fourth digital detection signals, respectively.

When the first magnetic sensor includes the first and second detectors and the first and second analog-to-digital converters while the second magnetic sensor includes the third and fourth detectors and the third and fourth analog-to-digital converters, the first magnetic sensor may further include a first data generator that generates the first detection data by performing arithmetic processing using the first and second digital detection signals. The second magnetic sensor may further include a second data generator that generates the second detection data by performing arithmetic processing using the third and fourth digital detection signals.

When the plurality of magnetic sensors are the first magnetic sensor and the second magnetic sensor, the first magnetic sensor may include a first detector and a second detector as the at least one detector, and a first analog-to-digital converter and a second analog-to-digital converter as the at least one analog-to-digital converter. The first and second detectors may generate first and second analog detection signals indicating the strengths of two components of the first applied magnetic field that are in mutually different directions. The first and second analog-to-digital converters convert the first and second analog detection signals into first and second digital detection signals, respectively. The second magnetic sensor may include a third detector and a fourth detector as the at least one detector, and a third analog-to-digital converter and a fourth analog-to-digital converter as the at least one analog-to-digital converter. The third and fourth detectors may generate third and fourth analog detection signals indicating the strengths of two components of the second applied magnetic field that are in mutually different directions. The third and fourth analog-to-digital converters convert the third and fourth analog detection signals into third and fourth digital detection signals, respectively. The first detection data may include the first and second digital detection signals. The second detection data may include the third and fourth digital detection signals.

When the plurality of magnetic sensors are configured to detect the foregoing applied magnetic field, the arithmetic processing performed by the processor may include arithmetic processing using a least squares method.

In the angle sensor of the present invention, the analog detection signal may contain an ideal component which varies in such a manner as to trace an ideal sinusoidal curve, and an error component corresponding to a harmonic of the ideal component. In such a case, the plurality of magnetic sensors may be configured so that the ideal components of the analog detection signals generated by the respective detectors of the plurality of magnetic sensors have mutually different phases.

In the angle sensor of the present invention, the plurality of magnetic sensors may be configured so that the analog detection signals generated by the respective detectors of the plurality of magnetic sensors have mutually different phases.

A detection device of the present invention is configured to detect physical information that varies depending on information to be detected, and to generate a detection value having a correspondence with the information to be detected. The detection device of the present invention includes a plurality of sensors each of which generates detection data having a correspondence with the physical information, and a processor that generates the detection value by performing arithmetic processing using a plurality of detection data generated by the plurality of sensors.

Each of the plurality of sensors includes at least one detector that detects the physical information and generates at least one analog detection signal having a correspondence with the information to be detected, and at least one analog-to-digital converter that samples the at least one analog detection signal generated by the at least one detector, converts the sampled at least one analog detection signal into at least one digital detection signal and outputs the at least one digital detection signal. In each of the plurality of sensors, the detection data is based on the at least one digital detection signal. The analog-to-digital converters in the plurality of sensors perform sampling at the same sampling time.

The detection device of the present invention may further include a plurality of electronic components. The plurality of sensors may be respectively included in different ones of the plurality of electronic components.

The detection device of the present invention may further include a clock generator that generates a sampling clock for determining the sampling time. In such a case, the analog-to-digital converters in the plurality of sensors may all be configured so that the sampling time is determined by the sampling clock generated by the clock generator.

When the detection device of the present invention includes the clock generator, the detection device may further include a plurality of electronic components, and the plurality of sensors may be respectively included in different ones of the plurality of electronic components. In such a case, the clock generator may be included in one of the plurality of electronic components or may be constructed separately from the plurality of electronic components.

When the detection device of the present invention includes the clock generator, the analog-to-digital converter may include a sample-and-hold circuit that samples the analog detection signal and a quantization circuit that quantizes an output signal of the sample-and-hold circuit. In such a case, the sample-and-hold circuit may be configured to alternate between a follow-up mode in which the output signal follows the analog detection signal and a holding mode in which the output signal is held at a constant value. The sampling time of the analog-to-digital converter may be a time at which the sample-and-hold circuit switches from the follow-up mode to the holding mode.

When the detection device of the present invention includes the clock generator, the analog-to-digital converter may include a quantization circuit that samples and quantizes the analog detection signal at the same time. In such a case, the sampling time of the analog-to-digital converter may be a time at which the quantization circuit samples and quantizes the analog detection signal.

According to the angle sensor of the present invention, the analog-to-digital converters in the plurality of magnetic sensors perform sampling at the same sampling time. This makes it possible to prevent the occurrence of an error in the detection value due to a difference between the plurality of magnetic sensors in timing of detection of the target magnetic field.

According to the detection device of the present invention, the analog-to-digital converters in the plurality of sensors perform sampling at the same sampling time. This makes it possible to prevent the occurrence of an error in the detection value due to a difference between the plurality of sensors in timing of detection of the physical information.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. To begin with, a description will be given of a sensor system including a detection device according to a first embodiment of the invention. The detection device according to the present embodiment is a device to detect physical information that varies depending on information to be detected, and to generate a detection value having a correspondence with the information to be detected. The detection device includes a plurality of sensors each of which generates detection data having a correspondence with the physical information.

In the present embodiment, the detection device is specifically a magnetic angle sensor 1. The information to be detected is an angle to be detected. The plurality of sensors are a plurality of magnetic sensors. Hereinafter, the angle to be detected will be referred to as an angle of interest, and denoted by a symbol $\theta$. The angle sensor 1 detects a target magnetic field as the physical information, the target magnetic field being a magnetic field whose direction varies depending on the angle of interest $\theta$, and generates a detection value having a correspondence with the angle of interest $\theta$. Each of the plurality of magnetic sensors generates detection data having a correspondence with the angle of interest $\theta$.

Figure 1:
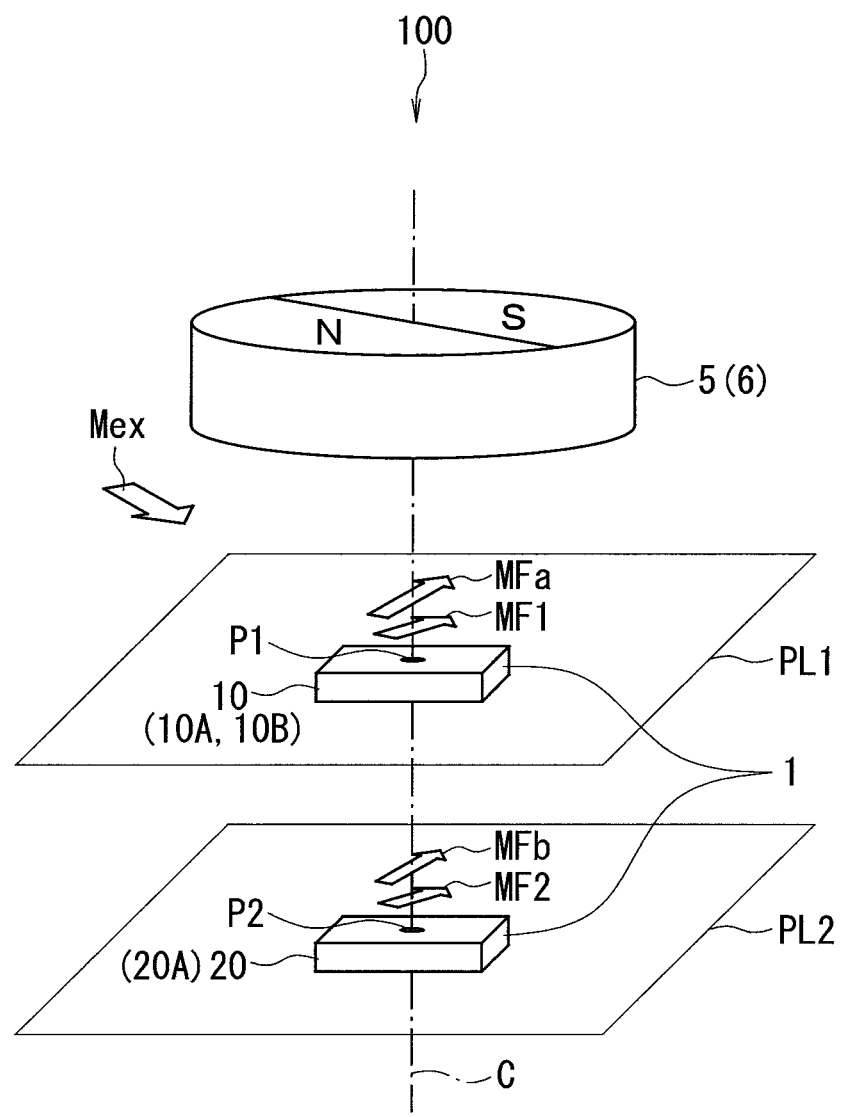
FIG. 1 is a perspective view showing a schematic configuration of a sensor system of a first embodiment of the invention.

FIG. 1 shows a schematic configuration of a sensor system 100 including the angle sensor 1 as the detection device. The sensor system 100 further includes a physical information generator 5. The physical information generator 5 of the present embodiment is a magnetic field generator that generates a target magnetic field as the physical information. As an example of the magnetic field generator, FIG. 1 shows a magnet 6 of a cylindrical shape having a central axis on a rotation axis C. The magnet 6 has an N pole and an S pole arranged symmetrically with respect to an imaginary plane including the foregoing central axis. The magnet 6 rotates around the rotation axis C. The angle of interest $\theta$ in the present embodiment is an angle corresponding to the rotational position of the magnet 6.

The plurality of magnetic sensors are configured to detect the target magnetic field at mutually different detection positions. The angle sensor 1 further includes a plurality of electronic components. The plurality of magnetic sensors are respectively included in different ones of the plurality of electronic components. Respective main bodies of the plurality of electronic components are physically separated from one another. The plurality of electronic components may be electrically connected via signal lines that transmit a sampling clock, which will be described later.

In the present embodiment, the plurality of magnetic sensors are a first magnetic sensor 10A and a second magnetic sensor 20A, and the plurality of electronic components are two electronic components 10 and 20. The first magnetic sensor 10A is included in the electronic component 10. The second magnetic sensor 20A is included in the electronic component 20. The electronic components 10 and 20 are arranged to face one of opposite end faces of the magnet 6.

The first magnetic sensor 10A detects a first applied magnetic field MF1 at a first detection position P1 and generates first detection data. The first applied magnetic field MF1 includes the target magnetic field. The second magnetic sensor 20A detects a second applied magnetic field MF2 at a second detection position P2 and generates second detection data. The second applied magnetic field MF2 includes the target magnetic field. The first detection position P1 and the second detection position P2 are mutually different positions on an imaginary straight line passing through the magnet 6. The imaginary straight line may or may not coincide with the rotation axis C. FIG. 1 shows the former case. In the present embodiment, specifically, the second detection position P2 is located at a greater distance from the magnet 6 than the first detection position P1.

Hereinafter, the target magnetic field at the first detection position P1 will be referred to as a first partial magnetic field MFa, and the target magnetic field at the second detection position P2 will be referred to as a second partial magnetic field MFb. The directions of the first and second partial magnetic fields MFa and MFb vary depending on the angle of interest $\theta$. Because the first and second detection positions P1 and P2 are different from each other, the first and second partial magnetic fields MFa and MFb are different from each other in strength.

In addition to the target magnetic field, a noise magnetic field Mex other than the target magnetic field may also be applied to the angle sensor 1. The direction and strength of the noise magnetic field Mex at the second detection position P2 are the same as those at the first detection position P1. The noise magnetic field Mex may be a magnetic field whose direction and strength are temporally constant or vary temporally in a periodic manner or in a random manner.

When the noise magnetic field Mex is applied to the angle sensor 1, the first applied magnetic field MF1 is a composite magnetic field of the first partial magnetic field MFa and the noise magnetic field Mex, and the second applied magnetic field MF2 is a composite magnetic field of the second partial magnetic field MFb and the noise magnetic field Mex.

Figure 2:
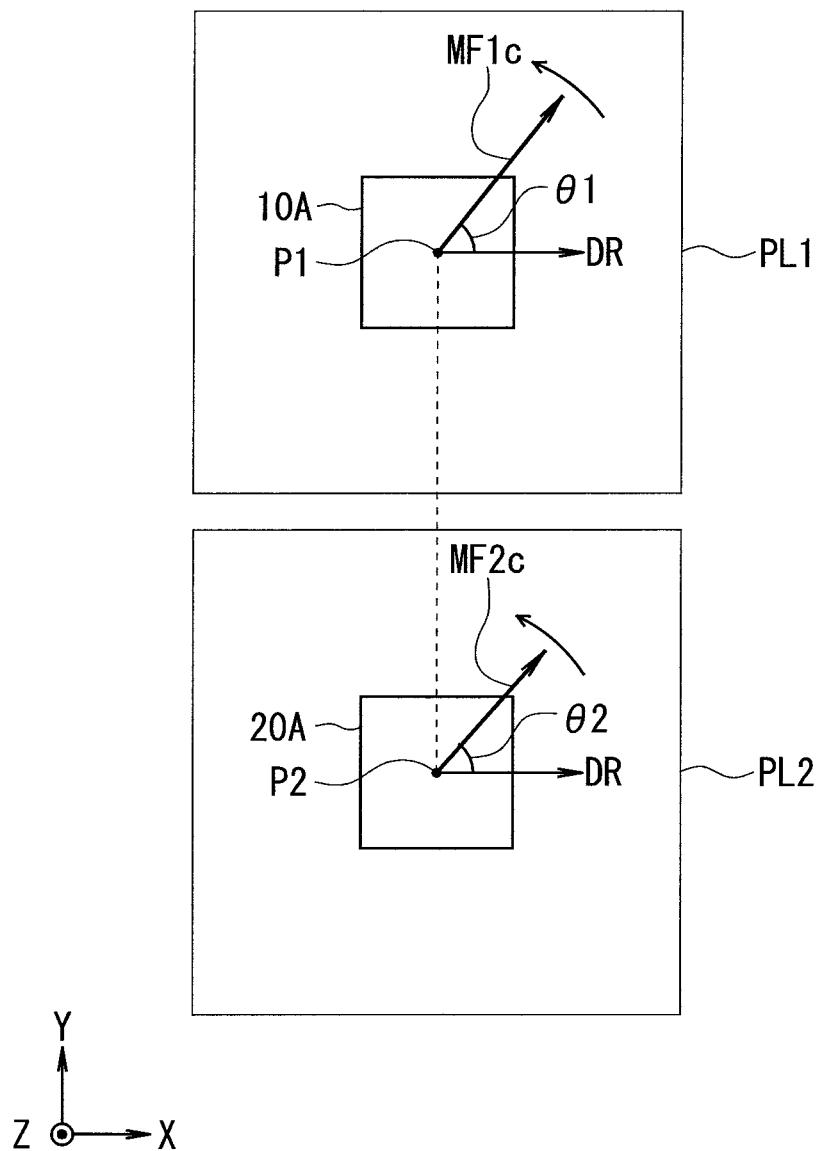
FIG. 2 is an explanatory diagram illustrating the definitions of directions, angles, a reference plane, and a reference direction for the first embodiment of the invention.

Definitions of directions, angles, a reference plane, and a reference direction for the present embodiment will now be described with reference to FIG. 1 and FIG. 2. First, Z direction is defined as the direction parallel to the rotation axis C shown in FIG. 1 and directed from bottom to top in FIG. 1. FIG. 2 shows the Z direction as the direction out of the plane of the drawing. X and Y directions are defined as two mutually orthogonal directions perpendicular to the Z direction. FIG. 2 shows the X direction as the rightward direction, and the Y direction as the upward direction.

Further, −X direction refers to the direction opposite to the X direction, and −Y direction refers to the direction opposite to the Y direction.

In the present embodiment, a first reference plane PL1 corresponding to the first detection position P1 and a second reference plane PL2 corresponding to the second detection position P2 are defined. The first and second reference planes PL1 and PL2 are imaginary planes perpendicular to the Z direction. The first and second reference planes PL1 and PL2 are thus parallel to each other. The first detection position P1 is a point of intersection of the first reference plane PL1 and the foregoing imaginary straight line. The second detection position P2 is a point of intersection of the second reference plane PL2 and the foregoing imaginary straight line.

Further, in the present embodiment, a reference direction DR is defined which serves as a basis for expressing the directions of the first and second applied magnetic fields MF1 and MF2. In the present embodiment, the reference direction DR is the X direction.

A component of the first applied magnetic field MF1, the component being parallel to the first reference plane PL1, will be referred to as a first applied magnetic field component MF1c. A component of the second applied magnetic field MF2, the component being parallel to the second reference plane PL2, will be referred to as a second applied magnetic field component MF2c. The directions of the first and second applied magnetic field components MF1c and MF1b are both assumed to rotate counterclockwise in FIG. 2. An angle that the direction of the first applied magnetic field component MF1c forms with respect to the reference direction DR will be referred to as a first angle, and denoted by a symbol θ1, as shown in FIG. 2. An angle that the direction of the second applied magnetic field component MF2c forms with respect to the reference direction DR will be referred to as a second angle, and denoted by a symbol θ2. The first and second angles θ1 and θ2 are expressed as positive values when viewed counterclockwise from the reference direction DR, and as negative values when viewed clockwise from the reference direction DR.

The first partial magnetic field MFa is the main component of the first applied magnetic field MF1. The second partial magnetic field MFb is the main component of the second applied magnetic field MF2. The direction of the first partial magnetic field MFa and the direction of the second partial magnetic field MFb are the same. As described above, the directions of the first and second partial magnetic fields MFa and MFb vary depending on the angle of interest θ. Accordingly, the first and second angles θ1 and θ2 vary depending on the angle of interest θ.

The direction of the first partial magnetic field MFa is parallel or almost parallel to the first reference plane PL1. The direction of the second partial magnetic field MFb is parallel or almost parallel to the second reference plane PL2. Hereinafter, the angle that the direction of the first partial magnetic field MFa forms with respect to the reference direction DR will be referred to as a first rotating field angle, and the angle that the direction of the second partial magnetic field Mfb forms with respect to the reference direction DR will be referred to as a second rotating field angle. The first rotating field angle and the second rotating field angle are equal. If the magnet 6 generates an ideal rotating magnetic field, both the first and second rotating field angles become equal to the angle of interest θ. In the present embodiment, both the first and second rotating field angles are assumed to be equal to the angle of interest θ. The first and second rotating field angles will hereinafter be simply referred to as a rotating field angle, as a generic term, and denoted by a symbol θM. The definitions of positive and negative values of the rotating field angle θM are the same as those of the first and second angles θ1 and θ2.

Since the main component of the first applied magnetic field MF1 is the first partial magnetic field MFa, the direction of the first applied magnetic field MF1 is parallel or almost parallel to the first reference plane PL1. Therefore, the angle that the direction of the first applied magnetic field MF1 forms with respect to the reference direction DR is equal or almost equal to the first angle θ1. Similarly, since the main component of the second applied magnetic field MF2 is the second partial magnetic field MFb, the direction of the second applied magnetic field MF2 is parallel or almost parallel to the second reference plane PL2. Therefore, the angle that the direction of the second applied magnetic field MF2 forms with respect to the reference direction DR is equal or almost equal to the second angle θ2.

Possible configurations of the sensor system 100 of the present embodiment are not limited to the example shown in FIG. 1. For example, the physical information generator 5 and the electronic components 10, 20 arranged as shown in FIG. 1 may be configured so that: the electronic components 10 and 20 rotate while the physical information generator 5 is fixed; the physical information generator 5 and the electronic components 10, 20 rotate in mutually opposite directions; or the physical information generator 5 and the electronic components 10, 20 rotate in the same direction with mutually different angular velocities.

The electronic components 10 and 20 may be arranged so that the first and second detection positions P1 and P2 lie in one imaginary plane perpendicular to the rotation axis C. In such a case, such an imaginary plane may be defined as a common reference plane for the first and second detection positions P1 and P2.

Figure 3:
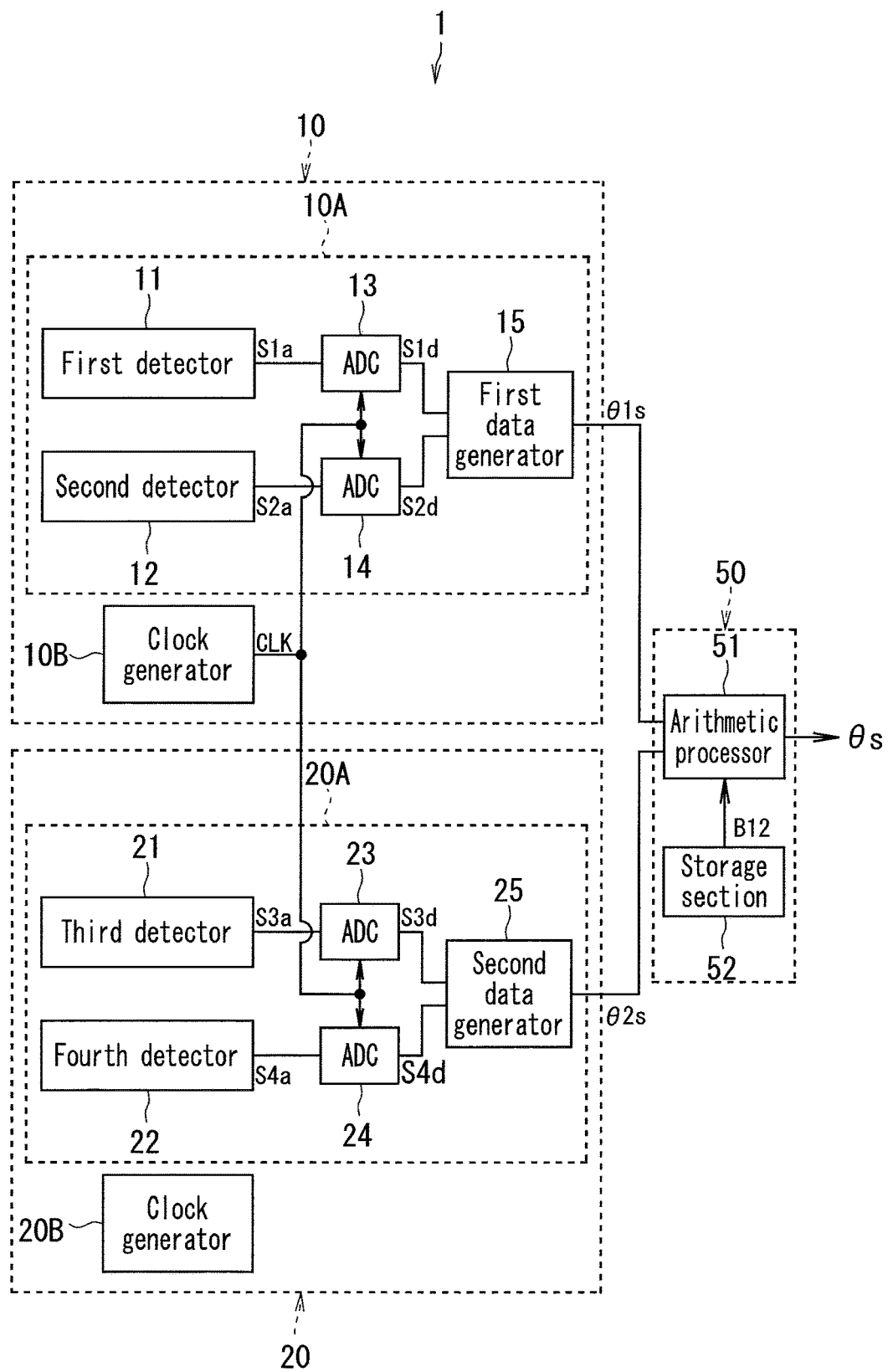
FIG. 3 is a functional block diagram showing the configuration of an angle sensor according to the first embodiment of the invention.

The configuration of the angle sensor 1 will now be described in detail with reference to FIG. 3. FIG. 3 is a functional block diagram showing the configuration of the angle sensor 1. As mentioned previously, the angle sensor 1 includes a plurality of magnetic sensors each of which generates detection data having a correspondence with the angle of interest θ. Each of the plurality of magnetic sensors includes at least one detector and at least one analog-to-digital converter (hereinafter referred to as ADC). The at least one detector detects a target magnetic field as physical information, and generates at least one analog detection signal having a correspondence with the angle of interest θ, which is information to be detected. The at least one ADC samples the at least one analog detection signal generated by the at least one detector, converts the sampled at least one analog detection signal into at least one digital detection signal and outputs the at least one digital detection signal. In each of the plurality of magnetic sensors, the detection data is based on the at least one digital detection signal. The ADCs in the plurality of magnetic sensors perform sampling at the same sampling time.

The angle sensor 1 further includes a clock generator that generates a sampling clock for determining the sampling time. The ADCs of the plurality of magnetic sensors are all configured so that the sampling time is determined by the sampling clock generated by the clock generator.

In the present embodiment, the plurality of magnetic sensors are the first magnetic sensor 10A and the second magnetic sensor 20A. The first magnetic sensor 10A includes a first detector 11 and a second detector 12 as the at least one detector. The first detector 11 generates a first analog detection signal S1a having a correspondence with the cosine of the first angle θ1. The second detector 12 generates a second analog detection signal S2a having a correspondence with the sine of the first angle θ1. The first analog detection signal S1a may have a correspondence with the strength of a component in the X direction of the first applied magnetic field MF1. The second analog detection signal S2a may have a correspondence with the strength of a component in the Y direction of the first applied magnetic field MF1.

The second magnetic sensor 20A includes a third detector 21 and a fourth detector 22 as the at least one detector. The third detector 21 generates a third analog detection signal S3a having a correspondence with the cosine of the second angle θ2. The fourth detector 22 generates a fourth analog detection signal S4a having a correspondence with the sine of the second angle θ2. The third analog detection signal S3a may have a correspondence with the strength of a component in the X direction of the second applied magnetic field MF2. The fourth analog detection signal S4a may have a correspondence with the strength of a component in the Y direction of the second applied magnetic field MF2.

Each of the first to fourth detectors 11, 12, 21 and 22 includes at least one magnetic detection element. The at least one magnetic detection element may include at least one magnetoresistive element. The magnetoresistive element may be a giant magnetoresistive (GMR) element, a tunneling magnetoresistive (TMR) element, or an anisotropic magnetoresistive (AMR) element. The at least one magnetic detection element may include at least one other element than a magnetoresistive element, such as a Hall element, for detecting a magnetic field.

As the direction of the target magnetic field rotates with a predetermined period, the first and second angles θ1 and θ2 vary with the predetermined period. In such a case, all the first to fourth analog detection signals S1a to S4a vary periodically with a signal period equal to the aforementioned predetermined period. The phase of the second analog detection signal S2a is different from the phase of the first analog detection signal S1a by an odd number of times ¼ the signal period. The third and fourth analog detection signals S3a and S4a are in phase with the first and second analog detection signals S1a and S2a, respectively. In the light of the production accuracy of the magnetic detection elements or other factors, the relationships among the phases of the analog detection signals may be slightly different from the above-described relationships.

The first magnetic sensor 10A includes a first ADC 13 and a second ADC 14 as the at least one ADC. The first and second ADCs 13 and 14 convert the first and second analog detection signals S1a and S2a into first and second digital detection signals S1d and S2d, respectively. The first magnetic sensor 10A further includes a first data generator 15 that generates first detection data θ1s by performing arithmetic processing using the first and second digital detection signals S1d and S2d. The first detection data θ1s indicates the first angle θ1.

The second magnetic sensor 20A includes a third ADC 23 and a fourth ADC 24 as the at least one ADC. The third and fourth ADCs 23 and 24 convert the third and fourth analog detection signals S3a and S4a into third and fourth digital detection signals S3d and S4d, respectively. The second magnetic sensor 20A further includes a second data generator 25 that generates second detection data θ2s by performing arithmetic processing using the third and fourth digital detection signals S3d and S4d. The second detection data θ2s indicates the second angle θ2.

The angle sensor 1 further includes a clock generator 10B that generates a sampling clock CLK for determining the sampling time. The sampling clock CLK is a signal that varies in voltage with a predetermined period. The sampling clock CLK may be a signal that alternates between a constant high-voltage state and a constant low-voltage state. In such a case, for example, the sampling time is defined in accordance with, for example, the timing at which the sampling clock CLK rises from the low-voltage state to the high-voltage state.

The clock generator 10B is included in the electronic component 10. The first to fourth ADCs 13, 14, 23 and 24 are all configured so that the sampling time is determined by the sampling clock CLK generated by the clock generator 10B. The clock generator 10B and the first to fourth ADCs 13, 14, 23 and 24 are electrically connected via signal lines that transmit the sampling clock CLK.

The angle sensor 1 further includes a clock generator 20B that generates a sampling clock. The clock generator 20B is included in the electronic component 20. In the present embodiment, the sampling clock generated by the clock generator 20B is not used to determine the sampling time of the first, second, third or fourth ADC 13, 14, 23 or 24.

The first and second ADCs 13 and 14, the first data generator 15 and the clock generator 10B can be implemented by a single application-specific integrated circuit (ASIC), for example. The third and fourth ADCs 23 and 24, the second data generator 25 and the clock generator 20B can be implemented by another single ASIC, for example.

The angle sensor 1 further includes a processor 50 that generates a detection value θs by performing arithmetic processing using a plurality of detection data generated by the plurality of magnetic sensors, that is, the first detection data θ1s and the second detection data θ2s. As described above, in the present embodiment the first and second partial magnetic fields MFa and MFb are different from each other in strength. This causes the noise magnetic field Mex to have different relative effects on the first detection data θ1s and the second detection data θ2s. This may result in differences dependent on the noise magnetic field Mex between the first detection data θ1s and the second detection data θ2s. Taking advantage of this characteristic, the processor 50 generates the detection value θs by performing arithmetic processing using the first and second detection data θ1s and θ2s so that the detection value θs contains reduced error caused by the noise magnetic field Mex as compared to the case of generating the detection value θs based on either one of the first detection data θ1s and the second detection data θ2s. The processor 50 can be implemented by an ASIC or microcomputer, for example. A method for generating the detection value θs will be described later.

Figure 4:
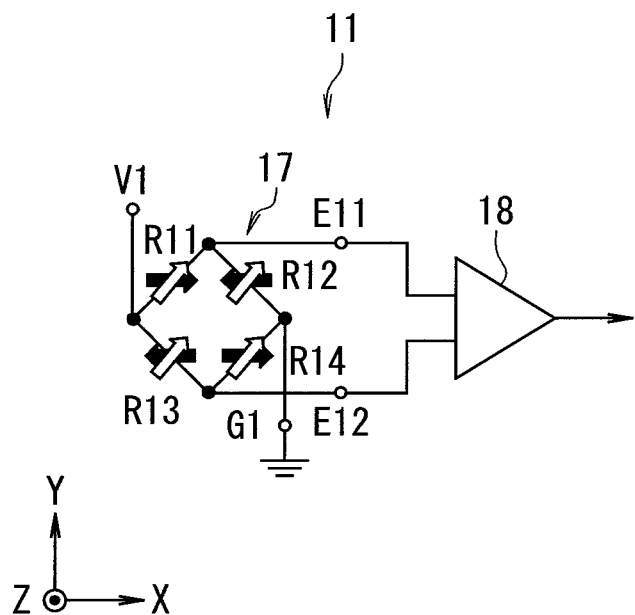
FIG. 4 is a circuit diagram showing an example configuration of a first detector of the first embodiment of the invention.

Next, the configuration of the first to fourth detectors 11, 12, 21 and 22 will be described. FIG. 4 shows a specific example of configuration of the first detector 11. In this example, the first detector 11 includes a Wheatstone bridge circuit 17 and a difference detector 18. The Wheatstone bridge circuit 17 includes four magnetic detection elements R11, R12, R13 and R14, a power supply port V1, a ground port G1, and two output ports E11 and E12. The magnetic detection element R11 is provided between the power supply port V1 and the output port E11. The magnetic detection element R12 is provided between the output port E11 and the ground port G1. The magnetic detection element R13 is provided between the power supply port V1 and the output port E12. The magnetic detection element R14 is provided between the output port E12 and the ground port G1. A power supply voltage of predetermined magnitude is applied to the power supply port V1. The ground port G1 is connected to ground.

The third detector 21 has the same configuration as the first detector 11. Thus, in the following description, components of the third detector 21 are denoted by the same reference signs as those used for the components of the first detector 11.

Figure 5:
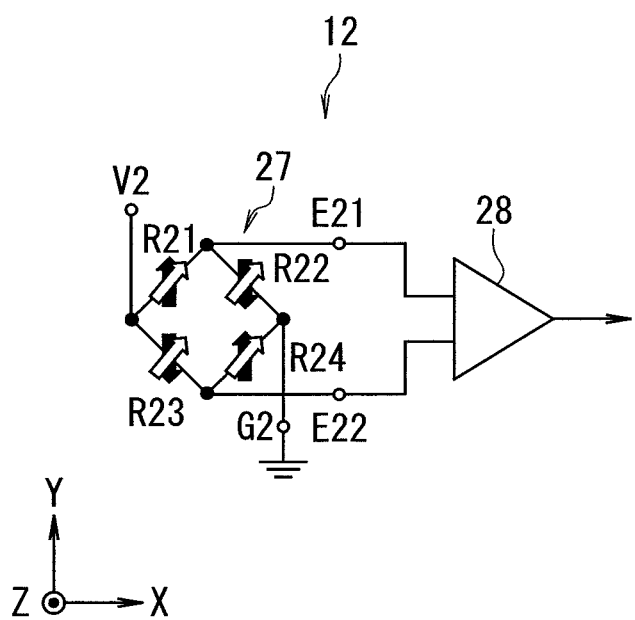
FIG. 5 is a circuit diagram showing an example configuration of a second detector of the first embodiment of the invention.

FIG. 5 shows a specific example of configuration of the second detector 12. In this example, the second detector 12 includes a Wheatstone bridge circuit 27 and a difference detector 28. The Wheatstone bridge circuit 27 includes four magnetic detection elements R21, R22, R23 and R24, a power supply port V2, a ground port G2, and two output ports E21 and E22. The magnetic detection element R21 is provided between the power supply port V2 and the output port E21. The magnetic detection element R22 is provided between the output port E21 and the ground port G2. The magnetic detection element R23 is provided between the power supply port V2 and the output port E22. The magnetic detection element R24 is provided between the output port E22 and the ground port G2. A power supply voltage of predetermined magnitude is applied to the power supply port V2. The ground port G2 is connected to ground.

The fourth detector 22 has the same configuration as the second detector 12. Thus, in the following description, components of the fourth detector 22 are denoted by the same reference signs as those used for the components of the second detector 12.

Each of the magnetic detection elements R11 to R14 and R21 to R24 may include a plurality of magnetoresistive (MR) elements connected in series. Each of the plurality of MR elements is a spin-valve MR element, for example. The spin-valve MR element includes a magnetization pinned layer whose magnetization direction is pinned, a free layer which is a magnetic layer whose magnetization direction varies depending on the direction of the target magnetic field, and a nonmagnetic layer located between the magnetization pinned layer and the free layer. The spin-valve MR element may be a TMR element or a GMR element. In the TMR element, the nonmagnetic layer is a tunnel barrier layer. In the GMR element, the nonmagnetic layer is a nonmagnetic conductive layer. The resistance of the spin-valve MR element varies depending on the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In FIG. 4 and FIG. 5, the filled arrows indicate the magnetization directions of the magnetization pinned layers of the MR elements, and the hollow arrows indicate the magnetization directions of the free layers of the MR elements.

In the first detector 11, the magnetization pinned layers of the MR elements included in the magnetic detection elements R11 and R14 are magnetized in the X direction, and the magnetization pinned layers of the MR elements included in the magnetic detection elements R12 and R13 are magnetized in the −X direction. In this case, the potential difference between the output ports E11 and E12 varies depending on the cosine of the first angle θ1. The difference detector 18 outputs a signal corresponding to the potential difference between the output ports E11 and E12 as the first analog detection signal S1a. Thus, the first analog detection signal S1a has a correspondence with the cosine of the first angle θ1.

In the second detector 12, the magnetization pinned layers of the MR elements included in the magnetic detection elements R21 and R24 are magnetized in the Y direction, and the magnetization pinned layers of the MR elements included in the magnetic detection elements R22 and R23 are magnetized in the −Y direction. In this case, the potential difference between the output ports E21 and E22 varies depending on the sine of the first angle θ1. The difference detector 28 outputs a signal corresponding to the potential difference between the output ports E21 and E22 as the second analog detection signal S2a. Thus, the second analog detection signal S2a has a correspondence with the sine of the first angle θ1.

In the third detector 21, the potential difference between the output ports E11 and E12 varies depending on the cosine of the second angle θ2. The difference detector 18 outputs a signal corresponding to the potential difference between the output ports E11 and E12 as the third analog detection signal S3a. Thus, the third analog detection signal S3a has a correspondence with the cosine of the second angle θ2.

In the fourth detector 22, the potential difference between the output ports E21 and E22 varies depending on the sine of the second angle θ2. The difference detector 28 outputs a signal corresponding to the potential difference between the output ports E21 and E22 as the fourth analog detection signal S4a. Thus, the fourth analog detection signal S4a has a correspondence with the sine of the second angle θ2.

In the light of the production accuracy of the MR elements and other factors, the magnetization directions of the magnetization pinned layers of the plurality of MR elements in the detectors 11, 12, 21 and 22 may be slightly different from the above-described directions.

Figure 6:
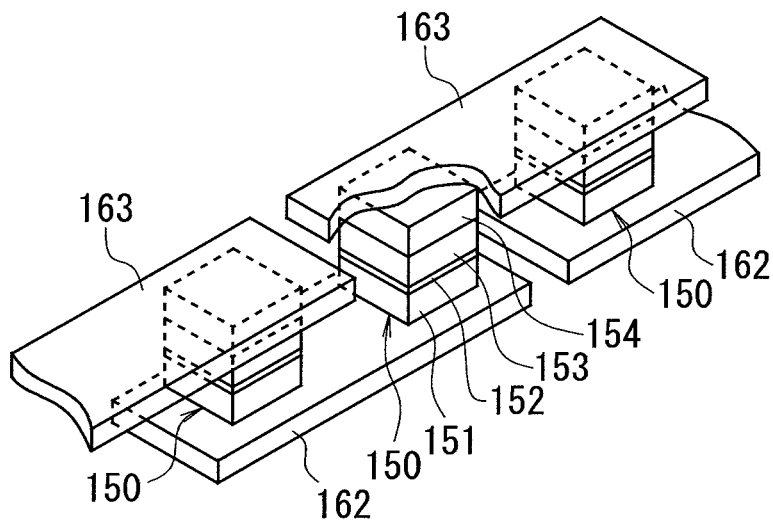
FIG. 6 is a perspective view of part of a magnetic detection element shown in FIGS. 4 and 5.

An example configuration of the magnetic detection elements will now be described with reference to FIG. 6. FIG. 6 is a perspective view of part of a magnetic detection element in the detectors 11 and 12 shown in FIG. 4 and FIG. 5. In this example, the magnetic detection element includes a plurality of lower electrodes 162, a plurality of MR elements 150, and a plurality of upper electrodes 163. The lower electrodes 162 are arranged on a substrate (not shown). Each lower electrode 162 has a long slender shape. Every two lower electrodes 162 that are adjacent to each other in the longitudinal direction of the lower electrodes 162 have a gap therebetween. As shown in FIG. 6, MR elements 150 are provided on the top surface of the lower electrode 162 at positions near opposite ends in the longitudinal direction. Each MR element 150 includes a free layer 151, a nonmagnetic layer 152, a magnetization pinned layer 153, and an antiferromagnetic layer 154 which are stacked in this order, from closest to farthest from the lower electrode 162. The free layer 151 is electrically connected to the lower electrode 162. The antiferromagnetic layer 154 is formed of an antiferromagnetic material, and is in exchange coupling with the magnetization pinned layer 153 to thereby pin the magnetization direction of the magnetization pinned layer 153. The upper electrodes 163 are arranged over the MR elements 150. Each upper electrode 163 has a long slender shape, and establishes electrical connection between the respective antiferromagnetic layers 154 of two adjacent MR elements 150 that are arranged on two lower electrodes 162 adjacent in the longitudinal direction of the lower electrodes 162. With such a configuration, the MR elements 150 in the magnetic detection element shown in FIG. 6 are connected in series by the upper electrodes 163 and lower electrodes 162.

The layers 151 to 154 of the MR elements 150 may be stacked in the reverse order to that shown in FIG. 6. The magnetization pinned layer 153 need not necessarily be a single ferromagnetic layer but may have an artificial antiferromagnetic structure including two ferromagnetic layers and a nonmagnetic metal layer interposed between the two ferromagnetic layers. The MR elements 150 may be configured without the antiferromagnetic layer 154.

The configuration of the first to fourth ADCs 13, 14, 23 and 24 will now be described. The first to fourth ADCs 13, 14, 23 and 24 have the same configuration.

The ADCs may be ones including a sample-and-hold circuit that samples an analog detection signal, or ones including no sample-and-hold circuit. Examples of the ADCs including a sample-and-hold circuit include a sequential comparison ADC. Examples of the ADCs including no sample-and-hold circuit include a parallel comparison ADC and an oversampling ADC. A typical example of the oversampling ADC is a delta-sigma ADC.

Hereinafter, any one of the first to fourth ADCs 13, 14, 23 and 24 configured as sequential comparison ADCs will be referred to as a first example ADC 70. Any one of the first to fourth ADCs 13, 14, 23 and 24 configured as parallel comparison ADCs will be referred to as a second example ADC 80. Any one of the first to fourth ADCs 13, 14, 23 and 24 configured as oversampling ADCs will be referred to as a third example ADC 90. The analog and digital detection signals corresponding to each of the ADCs 70, 80 and 90 will be denoted by the symbols Sa and Sd, respectively.

Figure 7:
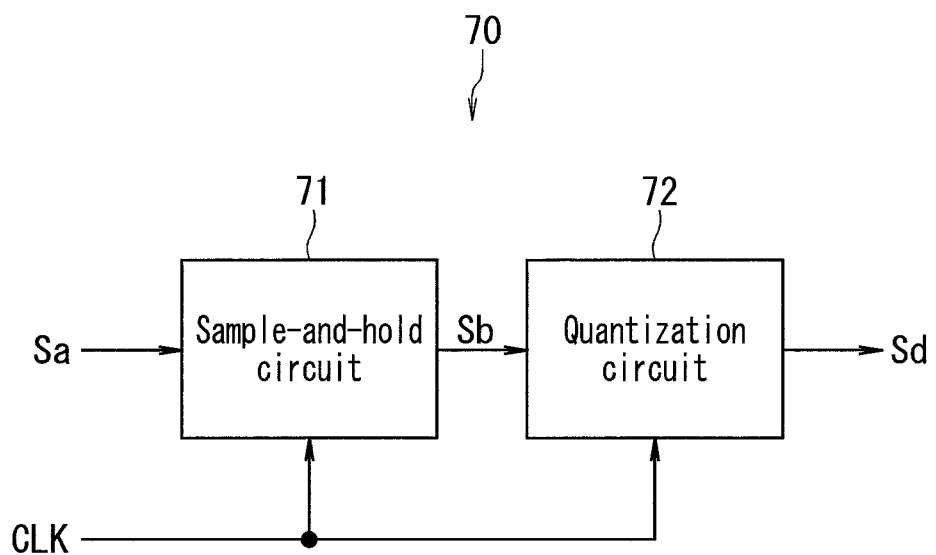
FIG. 7 is a functional block diagram showing the configuration of a first example ADC of the first embodiment of the invention.

FIG. 7 is a functional block diagram showing the configuration of the first example ADC 70. The ADC 70 includes a sample-and-hold circuit 71. The analog detection signal Sa and the sampling clock CLK are input to the sample-and-hold circuit 71. The sample-and-hold circuit 71 generates an output signal Sb. The sample-and-hold circuit 71 is configured to alternate between a follow-up mode and a holding mode with timing in accordance with the sampling clock CLK. In the follow-up mode, the output signal Sb follows the analog detection signal Sa. In the holding mode, the output signal Sb is held at a constant value. The sampling time of the ADC 70 is a time at which the sample-and-hold circuit 71 switches from the follow-up mode to the holding mode.

The ADC 70 further includes a quantization circuit 72 that quantizes the output signal Sb of the sample-and-hold circuit 71 in the holding mode. In particular, in the first example, the quantization circuit 72 performs quantization and encoding on the output signal Sb. The quantization refers to converting continuous values such as voltage values into discrete values. The encoding refers to converting discrete values into digital data of a particular rule. The output signal Sb and the sampling clock CLK are input to the quantization circuit 72. The quantization circuit 72 quantizes and encodes the output signal Sb in the holding mode to generate the digital detection signal Sd. For example, a quantization circuit including a comparator, a sequential comparison register circuit, and a digital-to-analog converter (hereinafter referred to as DAC) is used as the quantization circuit 72.

Figure 8:
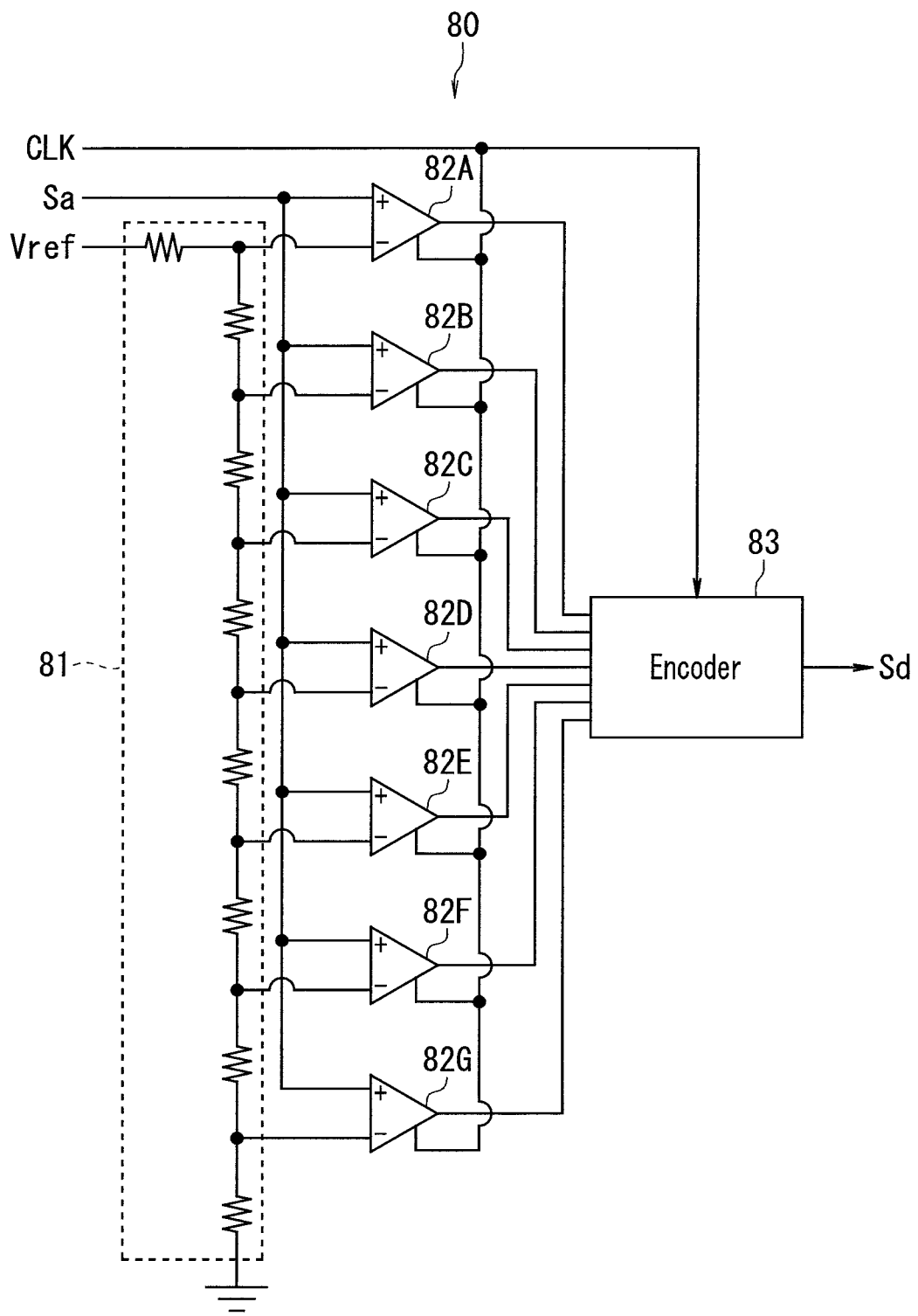
FIG. 8 is a functional block diagram showing the configuration of a second example ADC of the first embodiment of the invention.

FIG. 8 is a functional block diagram showing the configuration of the second example ADC 80. The ADC 80 includes a quantization circuit that samples and quantizes the analog detection signal Sa at the same time. The sampling time of the ADC 80 is a time at which the quantization circuit samples and quantizes the analog detection signal Sa.

Here, the resolution (in units of bits) of the ADC 80 will be denoted by N (N is an integer greater than or equal to 1). In the second example, the ADC 80 specifically includes, as its quantization circuit, a voltage dividing circuit 81 for dividing a reference voltage Vref into $(2^N-1)$ voltages, and $(2^N-1)$ comparators. The voltage dividing circuit 81 includes a power supply terminal to which the reference voltage Vref is applied, a ground terminal connected to ground, and a plurality of resistors connected in series between the power supply terminal and the ground terminal.

Each of the $(2^N-1)$ comparators includes a non-inverting input, an inverting input, a clock input, and an output. The analog detection signal Sa is received at the non-inverting input. The inverting input is connected to a node between two resistors among the plurality of resistors of the voltage dividing circuit 81, the two resistors corresponding to the comparator and being adjacent to each other in circuit configuration. The sampling clock CLK is received at the clock input. Each of the $(2^N-1)$ comparators compares the analog detection signal Sa received at the non-inverting input with the voltage received at the inverting input, and outputs the comparison result from the output as a quantized output signal. The $(2^N-1)$ comparators simultaneously perform the comparison based on the sampling clock CLK.

The ADC 80 further includes an encoder 83. The $(2^N-1)$ output signals of the $(2^N-1)$ comparators and the sampling clock CLK are input to the encoder 83. The encoder 83 encodes the $(2^N-1)$ output signals to generate the digital detection signal Sd.

FIG. 8 shows an example where the ADC 80 has a resolution of 3 bits, and the $(2^N-1)$ comparators are seven comparators 82A, 82B, 82C, 82D, 82E, 82F, and 82G.

FIG. 3 is a functional block diagram showing the configuration of the third example ADC 90. The ADC 90 includes a quantization circuit 93 that samples and quantizes the analog detection signal Sa at the same time. The sampling clock CLK is input to the quantization circuit 93. The quantization circuit 93 samples and quantizes the analog detection signal Sa with timing in accordance with the sampling clock CLK. The sampling time of the ADC 90 is a time at which the quantization circuit 93 performs sampling and quantization. The sampling clock CLK has a frequency higher than a sampling frequency of the encoded digital detection signal Sd having a predetermined number of bits. The quantization circuit 93 thus performs oversampling.

Figure 9:
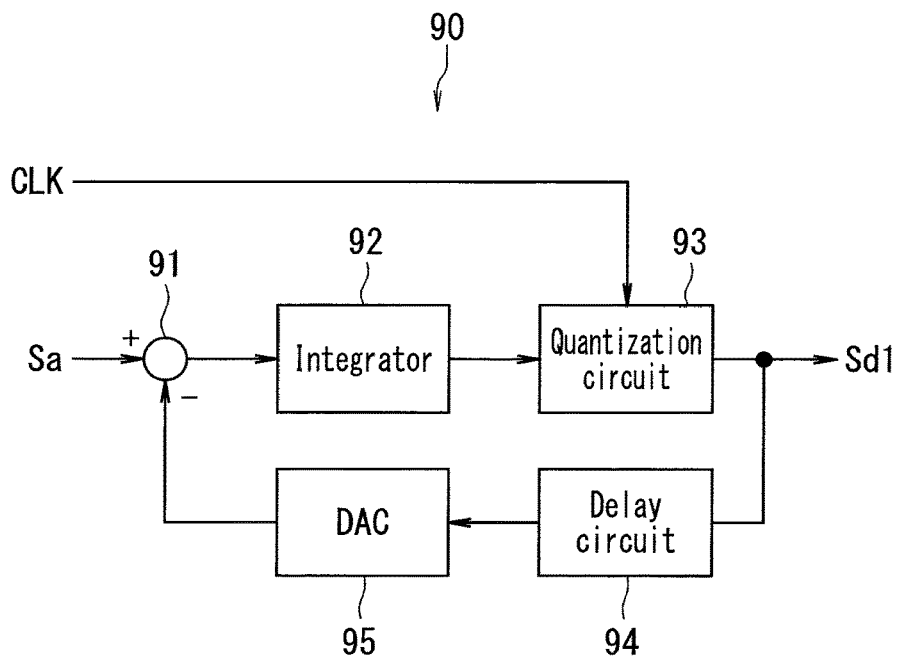
FIG. 9 is a functional block diagram showing the configuration of a third example ADC of the first embodiment of the invention.

FIG. 9 shows an example where the ADC 90 is configured as a delta-sigma ADC. In this example, the quantization circuit 93 is a comparator. The ADC 90 includes a differentiator 91, an integrator 92, a delay circuit 94 and a DAC 95, in addition to the quantization circuit 93.

The analog detection signal Sa and an analog signal output from the DAC 95 are input to the differentiator 91. The differentiator 91 outputs a difference between the analog detection signal Sa and the output signal of the DAC 95 to the integrator 92 as an output signal. The integrator 92 integrates the output signal of the differentiator 91 and outputs the integrated signal to the quantization circuit 93.

The output signal of the integrator 92 and the sampling clock CLK are input to the quantization circuit 93. The quantization circuit 93 compares the output signal of the integrator 92 with a predetermined reference voltage to quantize the output signal of the integrator 92, and outputs a one-bit signal Sd1. The one-bit signal Sd1 is input to the delay circuit 94.

The delay circuit 94 delays the signal Sd1 by one period of the sampling clock CLK, and outputs the resultant to the DAC 95. The DAC 95 converts the input signal into an analog signal, and outputs the analog signal to the differentiator 91.

The ADC 90 may further include a digital filter that receives the signal Sd1 output from the quantization circuit 93, performs processing for removing quantization errors, and outputs the digital detection signal Sd having a predetermined number of bits.

Next, a method for generating the first and second detection data θ1s and θ2s will be described. The first detection data θ1s is computed by the first data generator 15 in accordance with Eq. (1) below, for example.

$$\theta 1s = \operatorname{atan}(S2d/S1d) \tag{1}$$

Note that "a tan" represents an arctangent.

For θ1s ranging from 0° to less than 3600, Eq. (1) yields two solutions of θ1s that are 180° different in value. Which of the two solutions of θ1s in Eq. (1) is the true value of θ1s can be determined in accordance with the combination of the signs of S1d and S2d. The first data generator 15 determines θ1s within the range of 0° to less than 360° in accordance with Eq. (1) and the determination on the combination of the signs of S1d and S2d.

The second detection data θ2s is computed by the second data generator 25 in accordance with Eq. (2) below, for example.

$$\theta 2s = \operatorname{atan}(S4d/S3d) \tag{2}$$

For θ2s ranging from 0° to less than 3600, Eq. (2) yields two solutions of θ2s that are 180° different in value. Which of the two solutions of θ2s in Eq. (2) is the true value of θ2s can be determined in accordance with the combination of the signs of S3d and S4d. The second data generator 25 determines θ2s within the range of 0° to less than 360° in accordance with Eq. (2) and the determination on the combination of the signs of S3d and S4d.

A method for computing the detection value θs will now be described. To begin with, a description will be given of a relationship between the rotating field angle θM and the first and second angles θ1, θ2. If there is no noise magnetic field Mex, the first angle θ1 is equal to the rotating field angle θM. However, if the noise magnetic field Mex is present, the direction of the first applied magnetic field component MF1c may deviate from the direction of the first partial magnetic field MFa to cause the first angle θ1 to become different in value from the rotating field angle θM. Hereinafter, a difference between the first angle θ1 and the rotating field angle θM will be referred to as an angle error in the first angle θ1. The angle error in the first angle θ1 is caused by the noise magnetic field Mex.

Similarly, if there is no noise magnetic field Mex, the second angle θ2 is equal to the rotating field angle θM. However, if the noise magnetic field Mex is present, the direction of the second applied magnetic field component MF2c may deviate from the direction of the second partial magnetic field MFb to cause the second angle θ2 to become different in value from the rotating field angle θM. Hereinafter, a difference between the second angle θ2 and the rotating field angle θM will be referred to as an angle error in the second angle θ2. The angle error in the second angle θ2 is caused by the noise magnetic field Mex.

Figure 10A:
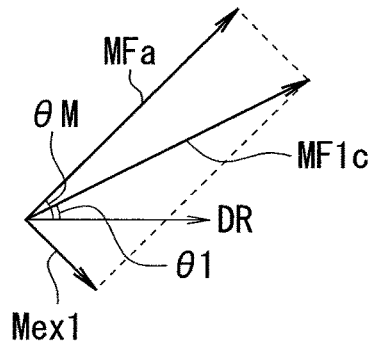
FIG. 10A is an explanatory diagram schematically showing a relationship between a first applied magnetic field component and a noise magnetic field in the first embodiment of the invention.
Figure 10B:
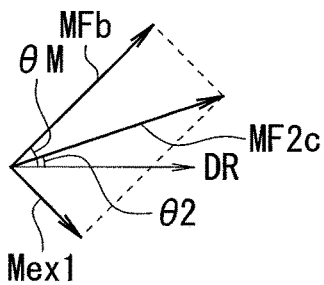
FIG. 10B is an explanatory diagram schematically showing a relationship between a second applied magnetic field component and the noise magnetic field in the first embodiment of the invention.

Now, the noise magnetic field Mex will be discussed in terms of first to third components. The first component is a component in a direction parallel to the first and second reference planes PL1 and PL2 and orthogonal to the directions of the first and second partial magnetic fields MFa and MFb. The second component is a component in a direction parallel to the directions of the first and second partial magnetic fields MFa and MFb. The third component is a component in a direction perpendicular to the first and second reference planes PL1 and PL2. FIGS. 10A and 10B are explanatory diagrams schematically showing relationships of the first and second applied magnetic field components MF1c and MF2c with the noise magnetic field Mex. In FIGS. 10A and 10B, the symbol Mex1 represents the first component of the noise magnetic field Mex. FIG. 10A shows the relationship between the first applied magnetic field component MF1c and the first component Mex of the noise magnetic field Mex. FIG. 10B shows the relationship between the second applied magnetic field component MF2c and the first component Mex1 of the noise magnetic field Mex. The magnitude of the first component Mex1 is exaggerated in FIGS. 10A and 10B. As shown in FIGS. 10A and 10B, the directions of the first and second applied magnetic field components MF1c and MF2c deviate from the directions of the first and second partial magnetic fields MFa and MFb, respectively, due to the effect of the first component Mex1.

In the present embodiment, it is assumed that the strength of the noise magnetic field Mex is sufficiently smaller than the strengths of the first and second partial magnetic fields MFa and MFb to the extent that the second component of the noise magnetic field Mex has a negligible effect on the directional deviations of the first and second applied magnetic field components MF1c and MF2c. Further, the third component of the noise magnetic field Mex does not affect the directions of the first and second applied magnetic field components MF1c and MF2c. In FIGS. 10A and 10B, the first applied magnetic field component MF1c is represented as a composite magnetic field of the first partial magnetic field MFa and the first component Mex1 of the noise magnetic field Mex, and the second applied magnetic field component MF2c is represented as a composite magnetic field of the second partial magnetic field MFb and the first component Mex1 of the noise magnetic field Mex.

As shown in FIG. 10A, a deviation of the direction of the first applied magnetic field component MF1c from the direction of the first partial magnetic field MFa causes the first angle θ1 to have an angle error. The angle error in the first angle θ1 is a tan(Bex/B1), where B1 represents the strength of the first partial magnetic field MFa, and Bex represents the strength of the first component Mex1 of the noise magnetic field Mex.

As shown in FIG. 10B, a deviation of the direction of the second applied magnetic field component MF2c from the direction of the second partial magnetic field MFb causes the second angle θ2 to have an angle error. The angle error in the second angle θ2 is a tan(Bex/B2), where B2 represents the strength of the second partial magnetic field MFb.

The first angle θ1 can be expressed using the rotating field angle θM and the angle error in the first angle θ1. Similarly, the second angle θ2 can be expressed using the rotating field angle θM and the angle error in the second angle θ2. Specifically, the first and second angles θ1 and θ2 can be expressed in Eqs. (3) and (4) below, respectively.

$$\theta 1 = \theta M - \operatorname{atan}(Bex/B1) \tag{3}$$

$$\theta 2 = \theta M - \operatorname{atan}(Bex/B2) \tag{4}$$

When x is sufficiently small, atan(x) can be approximated as AT·x. AT is a constant value, an example of which is 56.57. In the present embodiment, since the strength Bex of the first component Mex1 of the noise magnetic field Mex is sufficiently smaller than the strengths B1 and B2 of the first and second partial magnetic fields MFa and MFb, a tan(Bex/B1) can be approximated as AT·(Bex/B1), and a tan(Bex/B2) can be approximated as AT·(Bex/B2). Applying the approximation to Eq. (3) and rearranging the equation allows Bex to be expressed in Eq. (5) below.

$$Bex = -B1 \cdot (\theta 1 - \theta M)/AT \tag{5}$$

Applying the above-described approximation to Eq. (4) to rearrange the equation and further substituting Eq. (5) into the rearranged equation yields Eq. (6) below.

$$\theta 2 = \theta M + B1 \cdot (\theta 1 - \theta M)/B2 \quad (6)$$

Rearranging Eq. (6) allows the rotating field angle θM to be expressed in Eq. (7) below.

$$\theta M = \{\theta 2 - (B1/B2) \cdot \theta 1\} / \{1 - (B1/B2)\} \quad (7)$$

In Eq. (7), "B1/B2" represents the ratio of the strength B1 of the first partial magnetic field MFa to the strength B2 of the second partial magnetic field MFb. The ratio will hereinafter be denoted by the symbol B12. In the present embodiment, the value of the ratio B12 depends on the positional relationship between the first and second detection positions P1 and P2. The ratio B12 has a constant value regardless of the value of the rotating field angle θM.

Next, the method by which the processor 50 computes the detection value θs will be described concretely. As the arithmetic processing using a plurality of detection data, the processor 50 performs arithmetic processing using θ1s and θ2s, which are detection data of the first and second angles θ1 and θ2, and the ratio B12. To be more specific, as the arithmetic processing using a plurality of detection data, the processor 50 performs arithmetic processing expressed in Eq. (8) below, which is similar to Eq. (7), to thereby generate the detection value θs.

$$\theta s = (\theta 2s - B12 \cdot \theta 1s)/(1 - B12) \quad (8)$$

Eq. (8) results from replacing θM, θ1, θ2, and B1/B2 of Eq. (7) with θs, θ1s, θ2s, and B12, respectively.

The processor 50 includes an arithmetic processor 51 for computing the detection value θs, and a storage section 52 for storing the value of the ratio B12 of the strength B1 of the first partial magnetic field MFa to the strength B2 of the second partial magnetic field MFb. The arithmetic processor 51 computes the detection value θs in accordance with Eq. (8) using θ1s computed by the first data generator 15 of the first magnetic sensor 10A, θ2s computed by the second data generator 25 of the second magnetic sensor 20A, and the ratio B12 stored in the storage section 52.

The ratio B12 can be determined by measurement of the strengths B1 and B2 of the first and second partial magnetic fields MFa and MFb. The measurement of the strengths B1 and B2 is performed by a control unit (not illustrated) outside the angle sensor 1 prior to shipment or use of the angle sensor 1. The measurement of the strengths B1 and B2 may be performed using the first and second magnetic sensors 10A and 20A or other magnetic sensors.

According to the present embodiment, performing the arithmetic processing using the first and second detection data θ1s and θ2s enables generation of the detection value θs with reduced error caused by the noise magnetic field Mex as compared to the case of generating the detection value θs based on either one of the first detection data θ1s and the second detection data θ2s. The reason therefor will be described in detail below.

As is apparent from Eq. (3), the first angle θ1 varies depending on the angle error "a tan(Bex/B1)" caused by the noise magnetic field Mex. As is apparent from Eq. (4), the second angle θ2 varies depending on the angle error "a tan(Bex/B2)" caused by the noise magnetic field Mex. In the present embodiment, the first detection data θ1s indicates the first angle θ1, and the second detection data θ2s indicates the second angle θ2. Eqs. (3) and (4) thus indicate that the first and second detection data θ1s and θ2s are affected by the noise magnetic field Mex.

In the present embodiment, the strength B1 of the first partial magnetic field MFa and the strength B2 of the second partial magnetic field MFb are different from each other. This causes a difference between the relative effects of the noise magnetic field Mex on the first and second detection data θ1s and θ2s. As a result, there occurs a difference dependent on the noise magnetic field Mex between the first and second detection data θ1s and θ2s. Specifically, a difference dependent on the noise magnetic field Mex occurs between the values of the angle errors in the first and second angles θ1 and θ2. The rotating field angle θM expressed in Eq. (7) is led using this characteristic. In the present embodiment, the detection value θs is generated by performing arithmetic processing using the first and second detection data θ1s and θ2s, more specifically, the arithmetic processing expressed in Eq. (8).

The first detection data θ1s corresponds to a detection value θs that is generated based on only the first detection data θ1s. The second detection data θ2s corresponds to a detection value θs that is generated based on only the second detection data θ2s. Since the first and second angles θ1 and θ2 contain angle errors caused by the noise magnetic field Mex as described above, the first and second detection data θ1s and θ2s also contain errors caused by the noise magnetic fields Mex. On the other hand, since the rotating field angle θM contains no angle error caused by the noise magnetic field Mex, the detection value θs generated by performing the arithmetic processing expressed in Eq. (8) theoretically contains no error caused by the noise magnetic field Mex. The present embodiment thus enables generation of the detection value θs with reduced error caused by the noise magnetic field Mex as compared to the first and second detection data θ1s and θ2s.

According to the present embodiment, since the first to fourth ADCs 13, 14, 23 and 24 perform sampling at the same sampling time, it is possible to prevent the occurrence of error in the detection value θs. Such an effect will be described below through comparison with an angle sensor of a comparative example.

First, a description will be given of the configuration of the angle sensor of the comparative example. The angle sensor of the comparative example has a configuration basically the same as the configuration of the angle sensor 1 according to the present embodiment shown in FIG. 3. However, in the comparative example, the third and fourth ADCs 23 and 24 are configured so that the sampling time is determined by a sampling clock generated by the clock generator 20B, instead of the sampling clock CLK generated by the clock generator 10B.

Next, an error in the detection value generated by the angle sensor of the comparative example will be described. Assume here that the magnet 6 is rotating at a predetermined angular velocity ω. The timing at which the first magnetic sensor 10A detects the first applied magnetic field MF1 will be referred to as first timing, and the timing at which the second magnetic sensor 20A detects the second applied magnetic field MF2 as second timing. The duration of time from the first timing to the second timing will be referred to as a time difference DT. Suppose that θ1s and θ2s are the first and second detection data that the first and second magnetic sensors 10A and 20A obtain by detecting the first and second applied magnetic fields MF1 and MF2 simultaneously at the first timing. In such a case, the second detection data that the second magnetic sensor 20A obtains by detecting the second applied magnetic field MF2 at the second timing is approximately θ2s+ω·DT. ω·DT is the amount of change in the angle of interest θ resulting from the time difference DT. With the time difference DT taken into account, the detection value θs that the processor 50 generates can be expressed in Eq. (9) below.

$$\theta s = \{(\theta 2s + \omega \cdot DT) - B12 \cdot \theta 1s\}/(1-B12) \quad (9)$$

If the first timing and the second timing coincide with each other, the time difference DT is zero and Eq. (9) coincides with Eq. (8). On the other hand, if the first timing and the second timing do not coincide with each other, the time difference DT is other than zero and Eq. (9) does not coincide with Eq. (8). A difference between the detection value θs expressed in Eq. (9) and the detection value θs expressed in Eq. (8) will be referred to as an error in the detection value θs due to the time difference DT, and denoted by the symbol θE. The error θE is expressed in Eq. (10) below.

$$\theta E = \cap \cdot DT/(1-B12) \quad (10)$$

In the present embodiment, B12 is greater than 1. If B12 is greater than 1 and smaller than 2, then the absolute value of (1−B12) is smaller than 1. In such a case, the error θE is greater than the amount of change ω·DT in the angle of interest θ resulting from the time difference DT. As B12 approaches 1 and the absolute value of (1−B12) approaches 0, the error θE increases.

Figure 11:
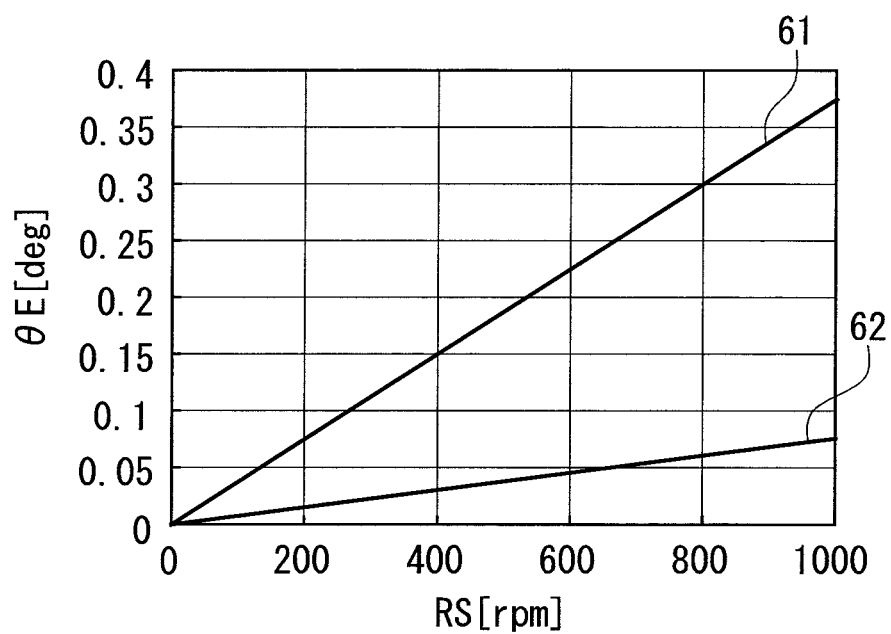
FIG. 11 is a characteristic chart showing a relationship between the rotation speed of a magnet and error in a detection value in the first embodiment of the invention.

FIG. 11 is a characteristic chart showing an example of relationship between the rotation speed RS of the magnet 6 and the error θE in the detection value θs. In FIG. 11, the horizontal axis represents the rotation speed RS, and the vertical axis represents the error θE. The rotation speed RS is proportional to the angular velocity ω. In this example, the time difference DT is 12.5 μs. In FIG. 11, the line denoted by the reference numeral 61 represents the relationship between the rotation speed RS and the error θE in a case where B12 is 1.2. The line denoted by the reference numeral 62 represents the relationship between the rotation speed RS and the error θE in a case where B12 is 2. As shown in FIG. 11, when compared for the same rotation speed RS, the error θE (reference numeral 61) in the case where B12 is 1.2 is greater than the error θE (reference numeral 62) in the case where B12 is 2.

In the present embodiment, the first to fourth ADCs 13, 14, 23 and 24 are all configured so that the sampling time is determined by the sampling clock CLK generated by the clock generator 10B. The first to fourth ADCs 13, 14, 23 and 24 are thus configured to perform sampling at the same sampling time. In the present embodiment, the timing at which the first magnetic sensor 10A detects the first applied magnetic field MF1 therefore coincides with the timing at which the second magnetic sensor 20A detects the second applied magnetic field MF2, and the time difference DT is zero. As a result, the error θE due to the time difference DT is also zero. The present embodiment thus makes it possible to prevent the occurrence of error in the detection value θs due to a difference between the plurality of magnetic sensors in timing of detection of the target magnetic field.

In the present embodiment, the first to fourth ADCs 13, 14, 23 and 24 may be configured so that the sampling time is determined by the sampling clock generated by the clock generator 20B instead of the clock generator 10B.

Second Embodiment

Figure 12:
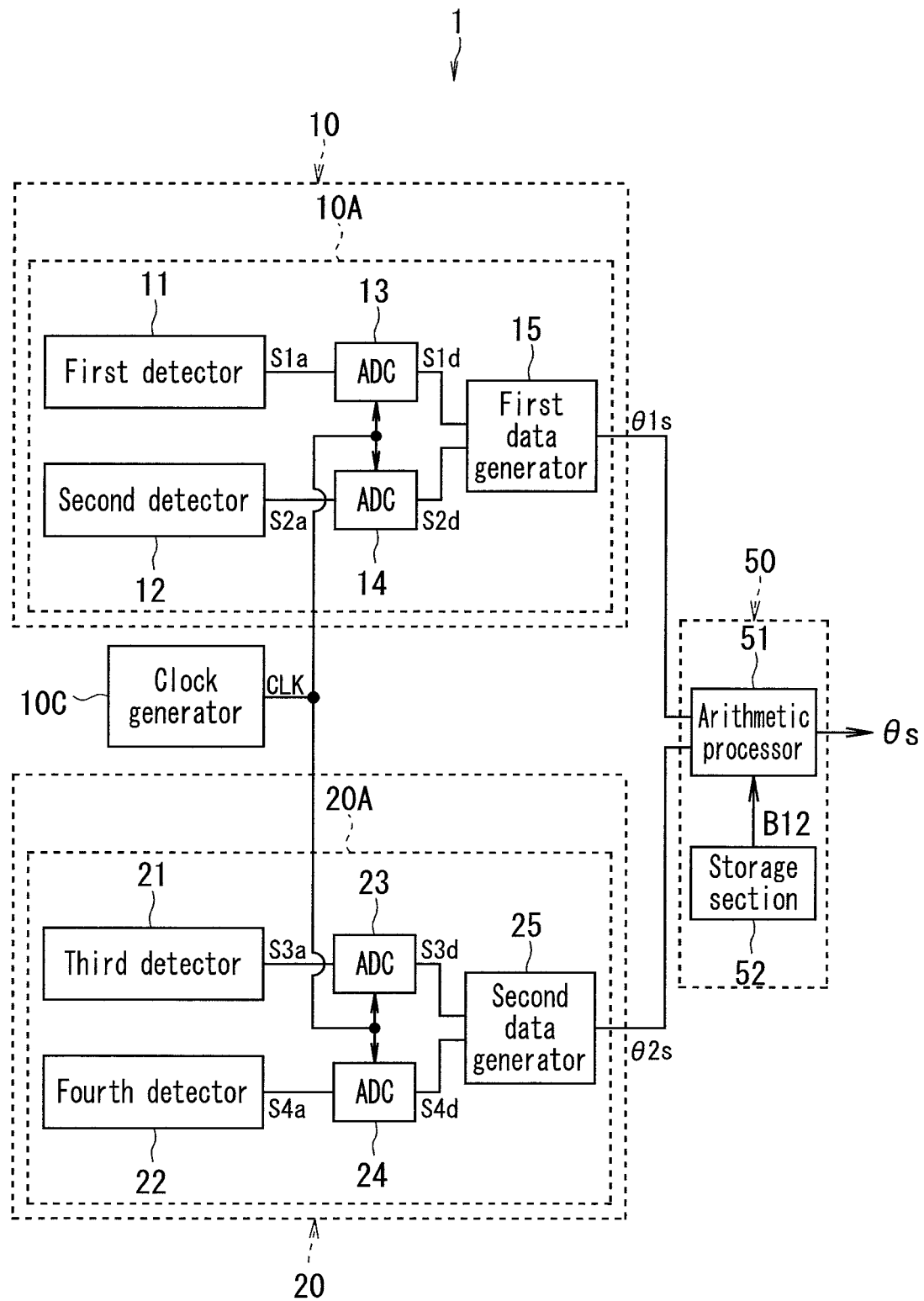
FIG. 12 is a functional block diagram showing the configuration of an angle sensor according to a second embodiment of the invention.

A second embodiment of the present invention will now be described. FIG. 12 is a functional block diagram showing the configuration of an angle sensor according to the present embodiment. The angle sensor 1 according to the present embodiment differs from the angle sensor 1 according to the first embodiment in the following ways. The clock generators 10B and 20B of the first embodiment are omitted from the present embodiment. Instead, the angle sensor 1 according to the present embodiment includes a clock generator 10C. The clock generator 10C is constructed separately from the electronic component 10 including the first magnetic sensor 10A and the electronic component 20 including the second magnetic sensor 20A.

Like the clock generator 10B, the clock generator 10C generates a sampling clock CLK for determining the sampling time. The first and second ADCs 13 and 14 of the first magnetic sensor 10A and the third and fourth ADCs 23 and 24 of the second magnetic sensor 20A are all configured so that the sampling time is determined by the sampling clock CLK generated by the clock generator 10C. The clock generator 10C and the first to fourth ADCs 13, 14, 23 and 24 are electrically connected via signal lines that transmit the sampling clock CLK.

The configuration, function and effects of the present embodiment are otherwise the same as those of the first embodiment.

Third Embodiment

A third embodiment of the present invention will now be described. First, reference is made to FIG. 13 to describe the configuration of an angle sensor 1 according to the present embodiment. The angle sensor 1 according to the present embodiment differs from the angle sensor 1 according to the first embodiment in the following ways. The first and second data generators 15 and 25 of the first embodiment are omitted from the present embodiment.

In the present embodiment, the first and second detectors 11 and 12 of the first magnetic sensor 10A generate first and second analog detection signals S1a and S2a indicating the strengths of two components of the first applied magnetic field MF1 that are in mutually different directions. In the present embodiment, specifically, these two components of the first applied magnetic field MF1 are in mutually orthogonal directions. In the present embodiment, the directions of the two components are the X direction and the Y direction (see FIG. 2). The first analog detection signal S1a indicates the strength of the X-direction component of the first applied magnetic field MF1. The second analog detection signal S2a indicates the strength of the Y-direction component of the first applied magnetic field MF1.

Similarly, in the present embodiment, the third and fourth detectors 21 and 22 of the second magnetic sensor 20A generate third and fourth analog detection signals S3a and S4a indicating the strengths of two components of the second applied magnetic field MF2 that are in mutually different directions. In the present embodiment, specifically, these two components of the second applied magnetic field MF2 are in mutually orthogonal directions. In the present embodiment, the directions of the two components are the X direction and the Y direction. The third analog detection signal S3a indicates the strength of the X-direction component of the second applied magnetic field MF2. The fourth analog detection signal S4a indicates the strength of the Y-direction component of the second applied magnetic field MF2.

In order for each of the first to fourth analog detection signals S1a to S4a to indicate the strength of a component in one direction of a magnetic field as described above, the first to fourth detectors 11, 12, 21 and 22 need to be used under the condition that the magnitudes of the first to fourth analog detection signals S1a to S4a do not become saturated within the range of the strengths of the first and second applied magnetic fields MF1 and MF2.

The first and second ADCs 13 and 14 of the first magnetic sensor 10A convert the foregoing first and second analog detection signals S1a and S2a into first and second digital detection signals S1d and S2d, respectively. In the present embodiment, the first detection data generated by the first magnetic sensor 10A includes the first and second digital detection signals S1d and S2d.

The third and fourth ADCs 23 and 24 of the second magnetic sensor 20A convert the foregoing third and fourth analog detection signals S3a and S4a into third and fourth digital detection signals S3d and S4d, respectively. In the present embodiment, the second detection data generated by the second magnetic sensor 20A includes the third and fourth digital detection signals S3d and S4d.

The angle sensor 1 according to the present embodiment includes a processor 250 in place of the processor 50 of the first embodiment. The processor 250 generates a detection value θs by performing arithmetic processing using the first and second detection data. The processor 250 can be implemented by an ASIC or a microcomputer, for example.

Next, the configuration of the first to fourth detectors 11, 12, 21 and 22 of the present embodiment will be described. The first and third detectors 11 and 21 of the present embodiment each have the same configuration as that of the first detector 11 of the first embodiment. Thus, in the following description, components of the first and third detectors 11 and 21 are denoted by the same reference signs as those used for the components of the first detector 11 of the first embodiment shown in FIG. 4. Similarly, the second and fourth detectors 12 and 22 of the present embodiment each have the same configuration as that of the second detector 12 of the first embodiment. Thus, in the following description, components of the second and fourth detectors 12 and 22 are denoted by the same reference signs as those used for the components of the second detector 12 of the first embodiment shown in FIG. 5.

In the first detector 11, the potential difference between the output ports E11 and E12 varies depending on the strength of the X-direction component of the first applied magnetic field MF1. The difference detector 18 of the first detector 11 outputs a signal corresponding to the potential difference between the output ports E11 and E12 as the first analog detection signal S1a.

In the second detector 12, the potential difference between the output ports E21 and E22 varies depending on the strength of the Y-direction component of the first applied magnetic field MF1. The difference detector 28 of the second detector 12 outputs a signal corresponding to the potential difference between the output ports E21 and E22 as the second analog detection signal S2a.

In the third detector 21, the potential difference between the output ports E11 and E12 varies depending on the strength of the X-direction component of the second applied magnetic field MF2. The difference detector 18 of the third detector 21 outputs a signal corresponding to the potential difference between the output ports E11 and E12 as the third analog detection signal S3a.

In the fourth detector 22, the potential difference between the output ports E21 and E22 varies depending on the strength of the Y-direction component of the second applied magnetic field MF2. The difference detector 28 of the fourth detector 22 outputs a signal corresponding to the potential difference between the output ports E21 and E22 as the fourth analog detection signal S4a.

Next, a method by which the processor 250 of the present embodiment generates the detection value θs will be described. Like the processor 50 of the first embodiment, the processor 250 generates the detection value θs by performing arithmetic processing using the first and second detection data so that the detection value θs contains reduced error caused by the noise magnetic field Mex as compared to the case of generating the detection value θs based on either one of the first and second detection data.

A vector representing the direction and strength of the first applied magnetic field MF1 will be denoted by the symbol H1. A vector representing the direction and strength of the second applied magnetic field MF2 will be denoted by the symbol H2. A vector representing the direction and strength of the first partial magnetic field MFa will be denoted by the symbol Ha. A vector representing the direction and strength of the second partial magnetic field MFb will be denoted by the symbol Hb. A vector representing the direction and strength of the noise magnetic field Mex will be denoted by the symbol Hex. The first applied magnetic field MF1 is a composite magnetic field of the first partial magnetic field MFa and the noise magnetic field Mex. The vector H1 can thus be expressed in Eq. (11) below using the vectors Ha and Hex.

$$H1 = Ha + Hex \quad (11)$$

As shown by Eq. (11), the direction and magnitude of the vector H1 vary depending on the vector Hex. In other words, Eq. (11) indicates that the vector H1 is affected by the noise magnetic field Mex.

The second applied magnetic field MF2 is a composite magnetic field of the second partial magnetic field MFb and the noise magnetic field Mex. The vector H2 can thus be expressed in Eq. (12) below using the vectors Hb and Hex.

$$H2 = Hb + Hex \quad (12)$$

As shown by Eq. (12), the direction and magnitude of the vector H2 vary depending on the vector Hex. In other words, Eq. (12) indicates that the vector H2 is affected by the noise magnetic field Mex.

Now, a vector H3 will be defined as in Eq. (13) below.

$$H3 = H1 - H2 \quad (13)$$

Substituting Eqs. (11) and (12) into Eq. (13) yields Eq. (14) below.

$$H3 = H1 - H2 = Ha + Hex - (Hb + Hex) = Ha - Hb \quad (14)$$

As has been described in relation to the first embodiment, the direction of the first partial magnetic field MFa and the direction of the second partial magnetic field MFb are the same, and therefore the vectors Ha and Hb are in the same direction. On the other hand, since the strength of the first partial magnetic field MFa and the strength of the second partial magnetic field MFb are different from each other, the vectors Ha and Hb have different magnitudes. As shown by Eq. (14), performing arithmetic processing to determine a difference between the vectors H1 and H2 makes it possible to cancel out the vectors Hex and thereby generate the vector H3 that is in the same direction as the vectors Ha and Hb and unaffected by the noise magnetic field Mex. The processor 250 determines the direction of the vector H3 to thereby generate the detection value θs unaffected by the noise magnetic field Mex.

In the present embodiment, the first and second digital detection signals S1d and S2d are assumed to be two components of the vector H1 in an orthogonal coordinate system, and the third and fourth digital detection signals S3$d$ and S4$d$ are assumed to be two components of the vector H2 in the orthogonal coordinate system.

Figure 13:
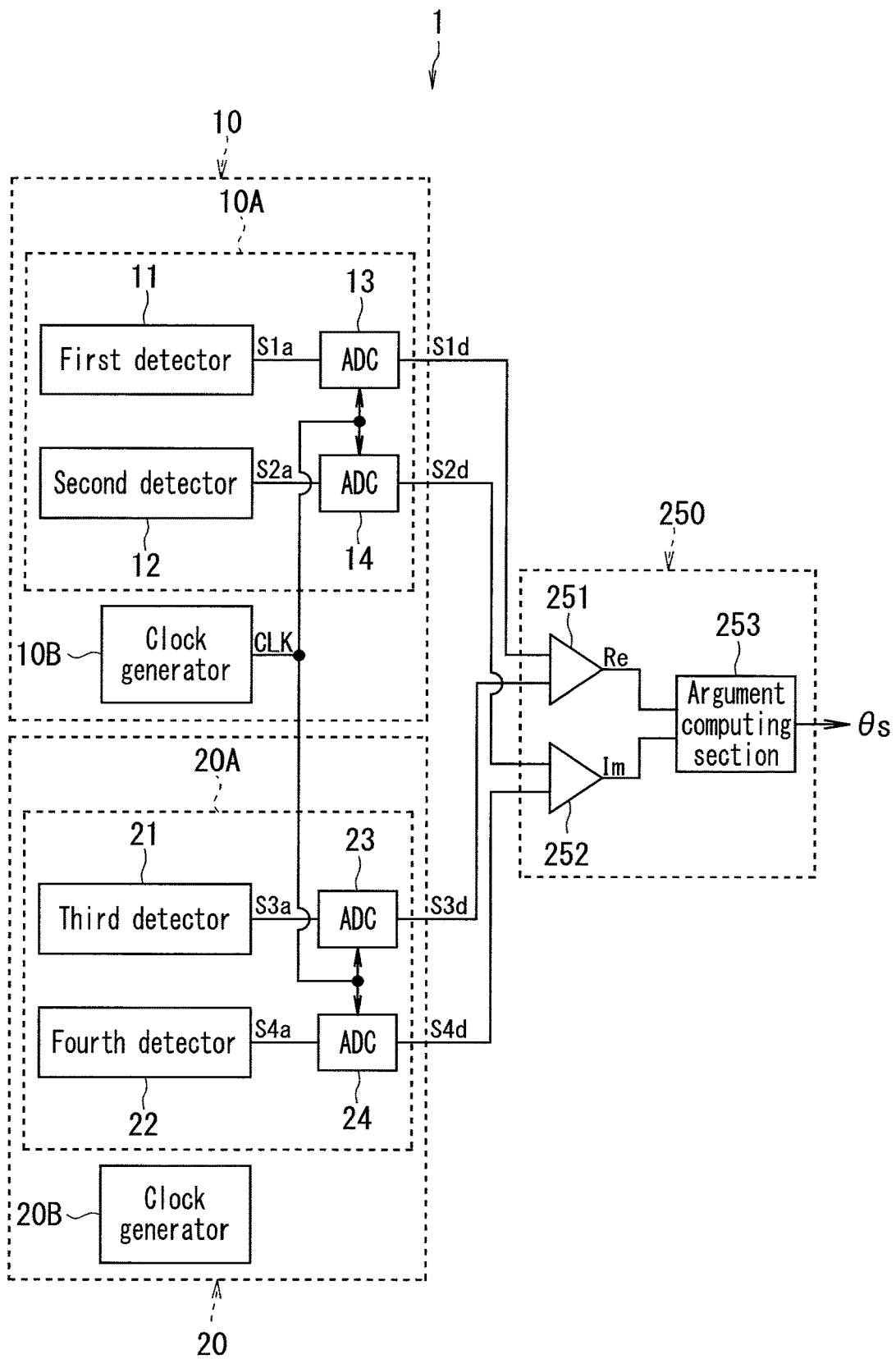
FIG. 13 is a functional block diagram showing the configuration of an angle sensor according to a third embodiment of the invention.

FIG. 13 shows an example of configuration of the processor 250. In this example, the processor 250 includes a first computing section 251, a second computing section 252, and an argument computing section 253. The processor 250 handles the first and second digital detection signals S1$d$ and S2$d$, which are the two components of the vector H1 in the orthogonal coordinate system, as the real part and imaginary part of a complex representation of the vector H1. The processor 250 handles the third and fourth digital detection signals S3$d$ and S4$d$, which are the two components of the vector H2 in the orthogonal coordinate system, as the real part and imaginary part of a complex representation of the vector H2.

The first computing section 251 determines a real part Re of a complex representation of the vector H3 by performing arithmetic processing to determine a difference between the first digital detection signal S1$d$ and the third digital detection signal S3$d$. The second computing section 252 determines an imaginary part Im of the complex representation of the vector H3 by performing arithmetic processing to determine a difference between the second digital detection signal S2$d$ and the fourth digital detection signal S4$d$. The real part Re and the imaginary part Im are given by Eqs. (15) and (16) below, respectively.

$$Re = S1d - S3d \quad (15)$$

$$Im = S2d - S4d \quad (16)$$

The argument of the complex number computed from the real part Re and the imaginary part Im corresponds to the direction of the vector H3. The argument is used as the detection value θs in the present embodiment. For example, the argument computing section 253 computes the detection value θs in accordance with Eq. (17) below.

$$\theta s = \operatorname{atan}(Im/Re) \quad (17)$$

For θs ranging from 0° to less than 360°, Eq. (17) yields two solutions of θs that are 180° different in value. Which of the two solutions of θs in Eq. (17) is the true value of θs can be determined in accordance with the combination of the signs of Re and Im. The argument computing section 253 determines θs within the range of 0° to less than 360° in accordance with Eq. (17) and the determination on the combination of the signs of Re and Im.

θ1$s$ in the first embodiment corresponds to a detection value θs that is generated based on only the first detection data in the present embodiment, and θ2$s$ in the first embodiment corresponds to a detection value θs that is generated based on only the second detection data in the present embodiment. As has been described in relation to the first embodiment, θ1$s$ and θ2$s$ each contain an error caused by the noise magnetic fields Mex. On the other hand, since the vector H3 is expressed as a difference between the vectors Ha and Hb as shown by Eq. (14), the detection value θs generated in the above-described manner theoretically contains no error caused by the noise magnetic field Mex. The present embodiment thus enables generation of the detection value θs with reduced error caused by the noise magnetic field Mex, as compared to θ1$s$ and θ2$s$.

In the present embodiment, the clock generator to generate the sampling clock CLK for determining the sampling time of the first to fourth ADCs 13, 14, 23 and 24 may be constructed separately from the electronic components 10 and 20, as in the second embodiment.

The configuration, function and effects of the present embodiment are otherwise the same as those of the first or second embodiment.

Fourth Embodiment

Figure 14:
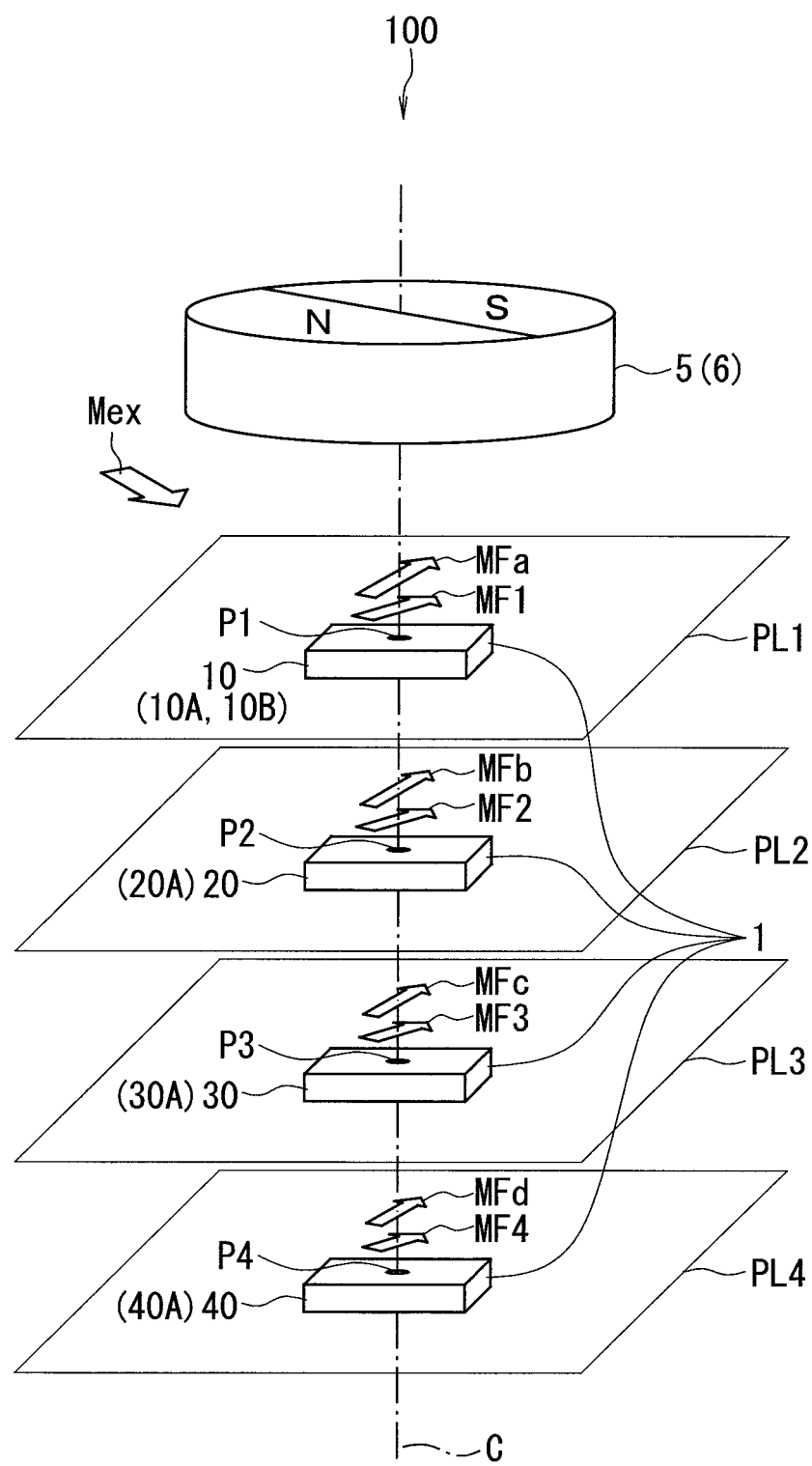
FIG. 14 is a perspective view showing a schematic configuration of a sensor system according to a fourth embodiment of the invention.

A fourth embodiment of the present invention will now be described. First, reference is made to FIG. 14 to describe the configuration of an angle sensor 1 according to the present embodiment. FIG. 14 is a perspective view showing a schematic configuration of a sensor system 100. The angle sensor 1 according to the present embodiment differs from the angle sensor 1 according to the first embodiment in the following ways. The angle sensor 1 according to the present embodiment includes a third magnetic sensor 30A and a fourth magnetic sensor 40A in addition to the first and second magnetic sensors 10A and 20A of the first embodiment, as the plurality of magnetic sensors. Furthermore, as the plurality of electronic components, the angle sensor 1 includes two electronic components 30 and 40 in addition to the electronic components 10 and 20 of the first embodiment. As in the first embodiment, the first magnetic sensor 10A is included in the electronic component 10. The second magnetic sensor 20A is included in the electronic component 20.

The third magnetic sensor 30A is included in the electronic component 30. The fourth magnetic sensor 40A is included in the electronic component 40. The electronic components 10, 20, 30 and 40 are arranged to face one end face of the magnet 6.

The first to fourth magnetic sensors 10A, 20A, 30A and 40A are configured to detect an applied magnetic field including the target magnetic field at mutually different detection positions. As in the first embodiment, the first magnetic sensor 10A detects a first applied magnetic field MF1 including the target magnetic field at a first detection position P1, and generates first detection data. The second magnetic sensor 20A detects a second applied magnetic field MF2 including the target magnetic field at a second detection position P2, and generates second detection data.

The third magnetic sensor 30A detects a third applied magnetic field MF3 including the target magnetic field at a third detection position P3, and generates third detection data. The fourth magnetic sensor 40A detects a fourth applied magnetic field MF4 including the target magnetic field at a fourth detection position P4, and generates fourth detection data.

The first to fourth detection positions P1 to P4 may be mutually different positions on an imaginary straight line passing through the magnet 6. The imaginary straight line may or may not coincide with the rotation axis C. FIG. 14 illustrates the former case. In this example, the first to fourth detection positions P1, P2, P3 and P4 are arranged in this order in the direction away from the magnet 6. Note that it is not necessarily required that all of the first to fourth detection positions P1 to P4 be collinear.

As in the first embodiment, the target magnetic field at the first detection position P1 will be referred to as a first partial magnetic field MFa, and the target magnetic field at the second detection position P2 will be referred to as a second partial magnetic field MFb. In the present embodiment, the target magnetic field at the third detection position P3 will be referred to as a third partial magnetic field MFc, and the target magnetic field at the fourth detection position P4 will be referred to as a fourth partial magnetic field MFd. The directions of the first to fourth partial magnetic fields MFa to MFd vary depending on the angle of interest θ. Because the first to fourth detection positions P1 to P4 are different from each other, the first to fourth partial magnetic fields MFa to MFd are different from each other in strength.

As has been described in relation to the first embodiment, a noise magnetic field Mex other than the target magnetic field may be applied to the angle sensor 1 in addition to the target magnetic field. The noise magnetic field Mex is in the same direction at the first to fourth detection positions P1 to P4, and has the same strength at the first to fourth detection positions P1 to P4. When the noise magnetic field Mex is applied to the angle sensor 1, the first applied magnetic field MF1 is a composite magnetic field of the first partial magnetic field MFa and the noise magnetic field Mex, the second applied magnetic field MF2 is a composite magnetic field of the second partial magnetic field MFb and the noise magnetic field Mex, the third applied magnetic field MF3 is a composite magnetic field of the third partial magnetic field MFc and the noise magnetic field Mex, and the fourth applied magnetic field MF4 is a composite magnetic field of the fourth partial magnetic field MFd and the noise magnetic field Mex.

Figure 16:
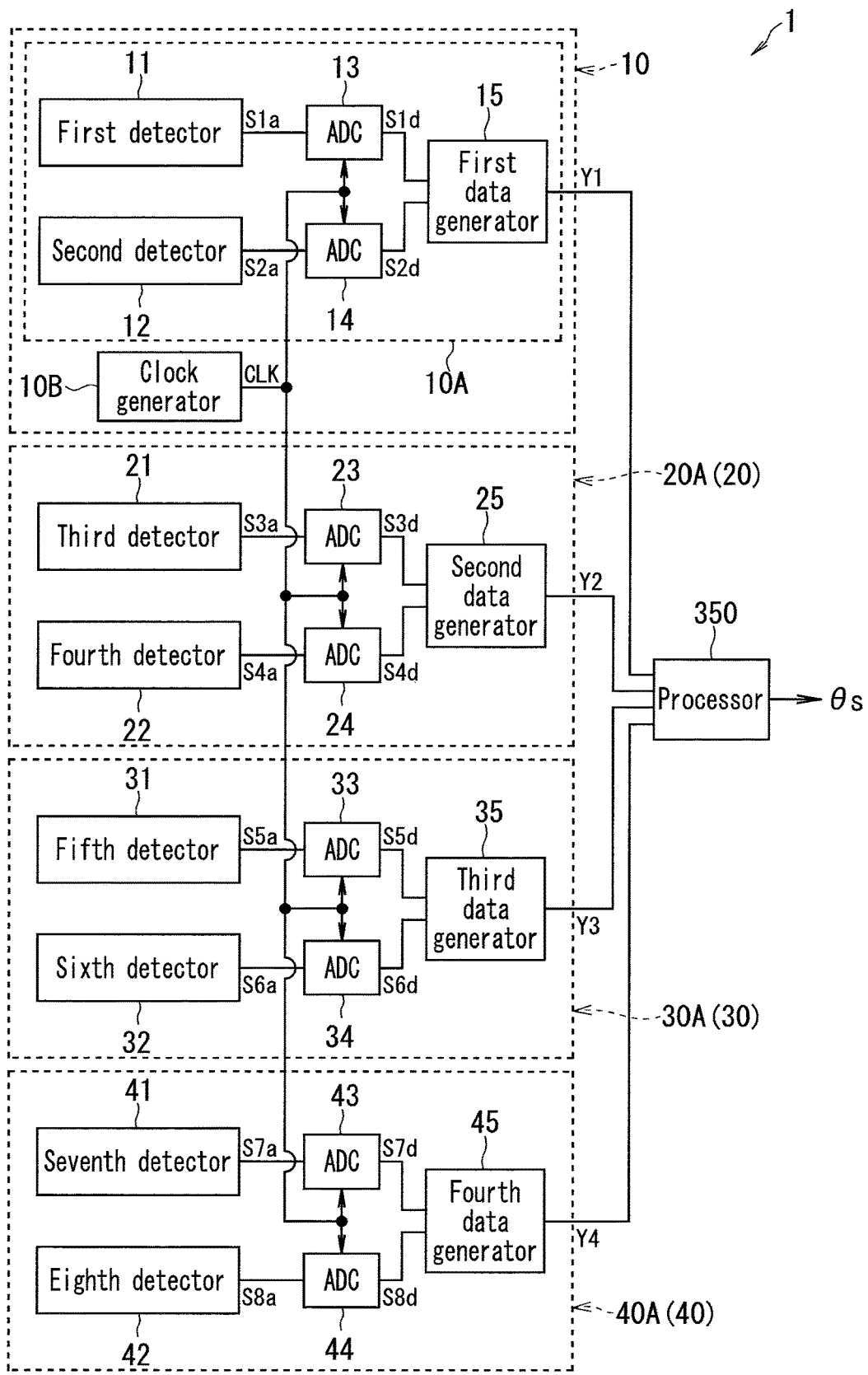
FIG. 16 is a functional block diagram showing the configuration of an angle sensor according to the fourth embodiment of the invention.

The angle sensor 1 according to the present embodiment includes the clock generator 10B, like the angle sensor 1 according to the first embodiment. The clock generator 10B is included in the electronic component 10. The angle sensor 1 includes a processor 350 instead of the processor 50 of the first embodiment. The processor 350 generates the detection value θs by performing arithmetic processing using the first to fourth detection data. The processor 350 is shown in FIG. 16, which will be described later. As described above, in the present embodiment the first to fourth partial magnetic fields MFa to MFd are different from each other in strength. This causes the noise magnetic field Mex to have different relative effects on the the first to fourth detection data. This may result in differences dependent on the noise magnetic field Mex between the first to fourth detection data. Taking advantage of this characteristic, the processor 350 generates the detection value θs by performing arithmetic processing using the first to fourth detection data so that the detection value θs contains reduced error caused by the noise magnetic field Mex as compared to the case of generating the detection value θs based on any one of the first to fourth detection data. The processor 350 can be implemented by an ASIC or microcomputer, for example.

Figure 15:
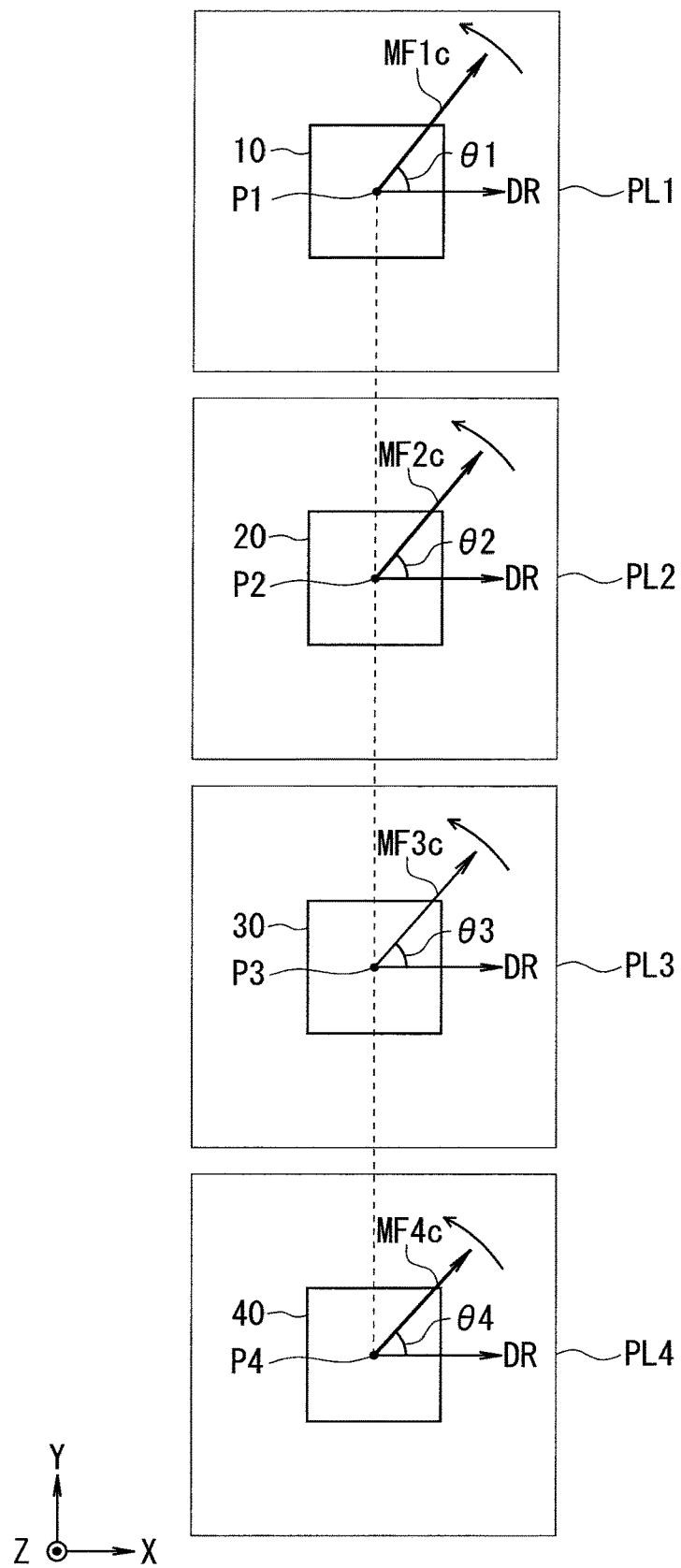
FIG. 15 is an explanatory diagram illustrating the definitions of directions, angles, a reference plane, and a reference direction for the fourth embodiment of the invention.

Definitions of directions, angles, a reference plane, and a reference direction for the present embodiment will now be described with reference to FIG. 14 and FIG. 15. The definitions of the X direction, the Y direction, the Z direction, the −X direction, the −Y direction, the first reference plane PL1, the second reference plane PL2, and the reference direction DR are the same as in the first embodiment.

In the present embodiment, a third reference plane PL3 corresponding to the third detection position P3 and a fourth reference plane PL4 corresponding to the fourth detection position P4 are defined, in addition to the first and second reference planes PL1 and PL2. The third and fourth reference planes PL3 and PL4 are imaginary planes perpendicular to the Z direction, like the first and second reference plane PL1 and PL2. The first to fourth reference planes PL1 to PL4 are thus parallel to each other. The third detection position P3 is a point of intersection of the third reference plane PL3 and the foregoing imaginary straight line. The fourth detection position P4 is a point of intersection of the fourth reference plane PL4 and the foregoing imaginary straight line.

As in the first embodiment, a component of the first applied magnetic field MF1, the component being parallel to the first reference plane PL1, will be referred to as a first applied magnetic field component MF1c. A component of the second applied magnetic field MF2, the component being parallel to the second reference plane PL2, will be referred to as a second applied magnetic field component MF2c. An angle that the direction of the first applied magnetic field component MF1c forms with respect to the reference direction DR will be referred to as a first angle θ. An angle that the direction of the second applied magnetic field component MF2c forms with respect to the reference direction DR will be referred to as a second angle θ2. A component of the third applied magnetic field MF3, the component being parallel to the third reference plane PL3, will be referred to as a third applied magnetic field component MF3c. A component of the fourth applied magnetic field MF4, the component being parallel to the fourth reference plane PL4, will be referred to as a fourth applied magnetic field component MF4c. An angle that the direction of the third applied magnetic field component MF3c forms with respect to the reference direction DR will be referred to as a third angle, and denoted by a symbol θ3, as shown in FIG. 15. An angle that the direction of the fourth applied magnetic field component MF4c forms with respect to the reference direction DR will be referred to as a fourth angle, and denoted by a symbol θ4. The definitions of positive and negative values of the third and fourth angles θ3 and 04 are the same as those of the first and second angles θ1 and θ2.

The main component of the first applied magnetic field MF1 is the first partial magnetic field MFa. The main component of the second applied magnetic field MF2 is the second partial magnetic field MFb. The main component of the third applied magnetic field MF3 is the third partial magnetic field MFc. The main component of the fourth applied magnetic field MF4 is the fourth partial magnetic field MFd. The first to fourth partial magnetic fields MFa to MFd are in the same direction. As described previously, the first to fourth partial magnetic fields MFa to MFd vary in direction depending on the angle of interest θ. The first to fourth angles θ1 to 04 therefore vary depending on the angle of interest θ.

Since the main component of the third applied magnetic field MF3 is the third partial magnetic field MFc, the direction of the third applied magnetic field MF3 is parallel or almost parallel to the third reference plane PL3. Therefore, the angle that the direction of the third applied magnetic field MF3 forms with respect to the reference direction DR is equal or almost equal to the third angle θ3. Similarly, since the main component of the fourth applied magnetic field MF4 is the fourth partial magnetic field MFd, the direction of the fourth applied magnetic field MF4 is parallel or almost parallel to the fourth reference plane PL4. Therefore, the angle that the direction of the fourth applied magnetic field MF4 forms with respect to the reference direction DR is equal or almost equal to the fourth angle θ4. As has been described in relation to the first embodiment, the angle that the direction of the first applied magnetic field MF1 forms with respect to the reference direction DR is equal or almost equal to the first angle θ1. The angle that the direction of the second applied magnetic field MF2 forms with respect to the reference direction DR is equal or almost equal to the second angle θ2.

Now, the configuration of the angle sensor 1 will be described in detail with reference to FIG. 16. FIG. 16 is a functional block diagram showing the configuration of the angle sensor 1. The configuration of the first magnetic sensor 10A is the same as that in the first embodiment. More specifically, the first magnetic sensor 10A includes the first and second detectors 11 and 12, the first and second ADCs 13 and 14, and the first data generator 15. In the present embodiment, the first and second detectors 11 and 12 generate first and second analog detection signals S1a and S2a indicating the strengths of two components of the first applied magnetic field MF1 that are in mutually different directions, as in the third embodiment. The first analog detection signal S1a indicates the strength of the X-direction component of the first applied magnetic field MF1. The second analog detection signal S2a indicates the strength of the Y-direction component of the first applied magnetic field MF1.

The configuration of the second magnetic sensor 20A is the same as that in the first embodiment. More specifically, the second magnetic sensor 20A includes the third and fourth detectors 21 and 22, the third and fourth ADCs 23 and 24, and the second data generator 25. In the present embodiment, the third and fourth detectors 21 and 22 generate third and fourth analog detection signals S3a and S4a indicating the strengths of two components of the second applied magnetic field MF2 that are in mutually different directions, as in the third embodiment. The third analog detection signal S3a indicates the strength of the X-direction component of the second applied magnetic field MF2. The fourth analog detection signal S4a indicates the strength of the Y-direction component of the second applied magnetic field MF2.

The third magnetic sensor 30A includes a fifth detector 31 and a sixth detector 32. The fifth and sixth detectors 31 and 32 generate fifth and sixth analog detection signals S5a and S6a indicating the strengths of two components of the third applied magnetic field MF3 that are in mutually different directions. In the present embodiment, specifically, these two components of the third applied magnetic field MF3 are in mutually orthogonal directions. In the present embodiment, the directions of the two components are the X direction and the Y direction. The fifth analog detection signal S5a indicates the strength of the X-direction component of the third applied magnetic field MF3. The sixth analog detection signal S6a indicates the strength of the Y-direction component of the third applied magnetic field MF3.

The fourth magnetic sensor 40A includes a seventh detector 41 and an eighth detector 42. The seventh and eighth detectors 41 and 42 generate seventh and eighth analog detection signals S7a and S8a indicating the strengths of two components of the fourth applied magnetic field MF4 that are in mutually different directions. In the present embodiment, specifically, these two components the fourth applied magnetic field MF4 are in mutually orthogonal directions. In the present embodiment, the directions of the two components are the X direction and the Y direction. The seventh analog detection signal S7a indicates the strength of the X-direction component of the fourth applied magnetic field MF4. The eighth analog detection signal S8a indicates the strength of the Y-direction component of the fourth applied magnetic field MF4.

In order for each of the first to eighth analog detection signals S1a to S8a to indicate the strength of a component in one direction of a magnetic field as described above, the first to eighth detectors 11, 12, 21, 22, 31, 32, 41 and 42 need to be used under the condition that the magnitudes of the first to eighth analog detection signals S1a to S8a do not become saturated within the range of the strengths of the first to fourth applied magnetic fields MF1 to MF4.

Each of the fifth to eighth detectors 31, 32, 41 and 42 includes at least one magnetic detection element, like the first to fourth detectors 11, 12, 21 and 22. The at least one magnetic detection element may include at least one magnetoresistive element.

As the direction of the target magnetic field rotates with a predetermined period, the first to fourth angles θ1 to θ4 vary with the predetermined period. In this case, all the first to eighth analog detection signals S1a to S8a vary periodically with a signal period the same as the aforementioned predetermined period. The phase of the second analog detection signal S2a is different from the phase of the first analog detection signal S1a by an odd number of times ¼ the signal period. The third, fifth and seventh analog detection signals S3a, S5a and S7a are in phase with the first analog detection signal S1a. The fourth, sixth and eighth analog detection signals S4a, S6a and S8a are in phase with the second analog detection signal S2a. In the light of the production accuracy of the magnetic detection elements or other factors, the relationships among the phases of these signals may be slightly different from the above-described relationships.

The third magnetic sensor 30A includes a fifth ADC 33 and a sixth ADC 34. The fifth and sixth ADCs 33 and 34 convert the fifth and sixth analog detection signals S5a and S6a into fifth and sixth digital detection signals S5d and S6d, respectively. The third magnetic sensor 30A further includes a third data generator 35 that generates third detection data by performing arithmetic processing using the fifth and sixth digital detection signals S5d and S6d. The fifth and sixth ADCs 33 and 34 and the third data generator 35 can be implemented by a single ASIC, for example.

The fourth magnetic sensor 40A includes a seventh ADC 43 and an eighth ADC 44. The seventh and eighth ADCs 43 and 44 convert the seventh and eighth analog detection signals S7a and S8a into seventh and eighth digital detection signals S7d and S8d, respectively. The fourth magnetic sensor 40A further includes a fourth data generator 45 that generates fourth detection data by performing arithmetic processing using the seventh and eighth digital detection signals S7d and S8d. The seventh and eighth ADCs 43 and 44 and the fourth data generator 45 can be implemented by a single ASIC, for example.

The first to eighth ADCs 13, 14, 23, 24, 33, 34, 43 and 44 are the same in configuration. The first to eighth ADCs 13, 14, 23, 24, 33, 34, 43 and 44 are all configured so that the sampling time is determined by the sampling clock CLK generated by the clock generator 10B. The clock generator 10B and the first to eighth ADCs 13, 14, 23, 24, 33, 34, 43 and 44 are electrically connected via signal lines that transmit the sampling clock CLK.

The configuration of the first to eighth detectors 11, 12, 21, 22, 31, 32, 41 and 42 will now be described. The first to fourth detectors 11, 12, 21 and 22 have the same configuration as in the third embodiment.

The fifth and seventh detectors 31 and 41 each have the same configuration as the first detector 11. Thus, in the following description, components of the fifth and seventh detectors 31 and 41 are denoted by the same reference signs as those used for the components of the first detector 11 of the first embodiment shown in FIG. 4. Similarly, the sixth and eighth detectors 32 and 42 each have the same configuration as the second detector 12. Thus, in the following description, components of the sixth and eighth detectors 32 and 42 are denoted by the same reference signs as those used for the components of the second detector 12 of the first embodiment shown in FIG. 5.

In the fifth detector 31, the potential difference between the output ports E11 and E12 varies depending on the strength of the X-direction component of the third applied magnetic field MF3. The difference detector 18 of the fifth detector 31 outputs a signal corresponding to the potential difference between the output ports E11 and E12 as the fifth analog detection signal S5a.

In the sixth detector 32, the potential difference between the output ports E21 and E22 varies depending on the strength of the Y-direction component of the third applied magnetic field MF3. The difference detector 28 of the sixth detector 32 outputs a signal corresponding to the potential difference between the output ports E21 and E22 as the sixth analog detection signal S6a.

In the seventh detector 41, the potential difference between the output ports E11 and E12 varies depending on the strength of the X-direction component of the fourth applied magnetic field MF4. The difference detector 18 of the seventh detector 41 outputs a signal corresponding to the potential difference between the output ports E11 and E12 as the seventh analog detection signal S7a.

In the eighth detector 42, the potential difference between the output ports E21 and E22 varies depending on the strength of the Y-direction component of the fourth applied magnetic field MF4. The difference detector 28 of the eighth detector 42 outputs a signal corresponding to the potential difference between the output ports E21 and E22 as the eighth analog detection signal S8a.

The strengths of the X-direction component and the Y-direction component of the first applied magnetic field MF1 are equal to those of the X-direction component and the Y-direction component of the first applied magnetic field component MF1c, respectively. The strengths of the X-direction component and the Y-direction component of the second applied magnetic field MF2 are equal to those of the X-direction component and the Y-direction component of the second applied magnetic field component MF2c, respectively. The strengths of the X-direction component and the Y-direction component of the third applied magnetic field MF3 are equal to those of the X-direction component and the Y-direction component of the third applied magnetic field component MF3c, respectively. The strengths of the X-direction component and the Y-direction component of the fourth applied magnetic field MF4 are equal to those of the X-direction component and the Y-direction component of the fourth applied magnetic field component MF4c, respectively.

Next, a method for generating the first to fourth detection data will be described. The first data generator 15 of the first magnetic sensor 10A generates a vector Y1 representing the direction and strength of the first applied magnetic field component MF1c, as the first detection data. The direction of the vector Y1 corresponds to the direction of the first applied magnetic field component MF1c. In the present embodiment, the direction of the vector Y1 will be denoted by $\theta 1s$ which indicates the first angle $\theta 1$. For example, the first data generator 15 computes $\theta 1s$ in accordance with Eq. (1) of the first embodiment.

The magnitude Ma1 of the vector Y1 corresponds to the strength of the first applied magnetic field component MF1c. The first data generator 15 determines the magnitude Ma1 by calculating the sum of the squares of the first digital detection signal S1d and the second digital detection signal S2d, i.e., $S1d^2+S2d^2$. $S1d^2+S2d^2$ is a parameter having a correspondence with the strength of the first applied magnetic field component MF1c.

The second data generator 25 of the second magnetic sensor 20A generates a vector Y2 representing the direction and strength of the second applied magnetic field component MF2c, as the second detection data. The direction of the vector Y2 corresponds to the direction of the second applied magnetic field component MF2c. In the present embodiment, the direction of the vector Y2 will be denoted by $\theta 2s$ which indicates the second angle $\theta 2$. For example, the second data generator 25 computes $\theta 2s$ in accordance with Eq. (2) of the first embodiment.

The magnitude Ma2 of the vector Y2 corresponds to the strength of the second applied magnetic field component MF2c. The second data generator 25 determines the magnitude Ma2 by calculating the sum of the squares of the third digital detection signal S3d and the fourth digital detection signal S4d, i.e., $S3d^2+S4d^2$. $S3d^2+S4d^2$ is a parameter having a correspondence with the strength of the second applied magnetic field component MF2c.

The third data generator 35 of the third magnetic sensor 30A generates a vector Y3 representing the direction and strength of the third applied magnetic field component MF3c, as the third detection data. The direction of the vector Y3 corresponds to the direction of the third applied magnetic field component MF3c. In the present embodiment, the direction of the vector Y3 will be denoted by $\theta 3s$ which indicates the third angle $\theta 3$. For example, the third data generator 35 computes $\theta 3s$ in accordance with Eq. (18) below.

$$\theta 3s = \mathrm{atan}(S6d/S5d) \qquad (18)$$

For $\theta 3s$ ranging from 0° to less than 360°, Eq. (18) yields two solutions of $\theta 3s$ that are 180° different in value. Which of the two solutions of $\theta 3s$ in Eq. (18) is the true value of $\theta 3s$ can be determined in accordance with the combination of the signs of S5d and S6d. The third data generator 35 determines $\theta 3s$ within the range of 0° to less than 360° in accordance with Eq. (18) and the determination on the combination of the signs of S5d and S6d.

The magnitude Ma3 of the vector Y3 corresponds to the strength of the third applied magnetic field component MF3c. The third data generator 35 determines the magnitude Ma3 by calculating the sum of the squares of the fifth digital detection signal S5d and the sixth digital detection signal S6d, i.e., $S5d^2+S6d^2$. $S5d^2+S6d^2$ is a parameter having a correspondence with the strength of the third applied magnetic field component MF3c.

The fourth data generator 45 of the fourth magnetic sensor 40A generates a vector Y4 representing the direction and strength of the fourth applied magnetic field component MF4c, as the fourth detection data. The direction of the vector Y4 corresponds to the direction of the fourth applied magnetic field component MF4c. In the present embodiment, the direction of the vector Y4 will be denoted by $\theta 4s$ which indicates the fourth angle $\theta 4$. For example, the fourth data generator 45 computes $\theta 4s$ in accordance with Eq. (19) below.

$$\theta 4s = \mathrm{atan}(S8d/S7d) \qquad (19)$$

For $\theta 4s$ ranging from 0° to less than 360°, Eq. (19) yields two solutions of $\theta 4s$ that are 180° different in value. Which of the two solutions of $\theta 4s$ in Eq. (19) is the true value of $\theta 4s$ can be determined in accordance with the combination of the signs of S7d and S8d. The fourth data generator 45 determines $\theta 4s$ within the range of 0° to less than 360° in accordance with Eq. (19) and the determination on the combination of the signs of S7d and S8d.

The magnitude Ma4 of the vector Y4 corresponds to the strength of the fourth applied magnetic field component MF4c. The fourth data generator 45 determines the magnitude Ma4 by calculating the sum of the squares of the seventh digital detection signal S7d and the eighth digital detection signal S8d, i.e., $S7d^2+S8d^2$. $S7d^2+S8d^2$ is a parameter having a correspondence with the strength of the fourth applied magnetic field component MF4c.

The magnitudes Ma1, Ma2, Ma3, and Ma4 may be $Sd^2+S2d^2$, $S3d^2+S4d^2$, $S5d^2+S6d^2$, and $S7d^2+S8d^2$ themselves, respectively. Alternatively, the magnitudes Ma1, Ma2, Ma3, and Ma4 may be the strengths of the applied magnetic field components MF1c, MF2c, MF3c, and MF4c obtained from $Sd^2+S2d^2$, $S3d^2+S4d^2$, $S5d^2+S6d^2$, and $S7d^2+S8d^2$, respectively. Otherwise, the data generators 15, 25, 35, and 45 may obtain the values of parameters that have correspondences with the strengths of the applied magnetic field components MF1c, MF2c, MF3c, and MF4c, other than $S1d^2+S2d^2$, $S3d^2+S4d^2$, $S5d^2+S6d^2$, and $S7d^2+S8d^2$, and determine the magnitudes Ma1, Ma2, Ma3, and Ma4 based on the values of the parameters.

Next, a configuration of the processor 350 and a method for generating the detection value θs will be described. To begin with, the method for generating the detection value θs in the present embodiment will be conceptually described. The arithmetic processing performed by the processor 350 includes one using a least squares method. The processor 350 assumes a first unknown M, a second unknown E, and a plurality of expected data. The first unknown M includes direction information corresponding to the detection value θs and magnitude information corresponding to the strength of the target magnetic field at a predetermined position. The second unknown E includes direction information corresponding to the direction of the noise magnetic field Mex and magnitude information corresponding to the strength of the noise magnetic field Mex. The plurality of expected data are information corresponding to a plurality of detection data expected based on the first and second unknowns M and E.

The processor 350 estimates the first and second unknowns M and E so as to minimize the sum of squares of differences between respective corresponding ones of the plurality of detection data and the plurality of expected data, and determines the detection value θs based on the estimated first unknown M.

In the present embodiment, the plurality of expected data are modeled by Eq. (20) below.

$$z = Hx \quad (20)$$

In Eq. (20), z represents an m-dimensional column vector that contains m number of elements having correspondences with the plurality of expected data generated based on the first and second unknowns M and E to be obtained, where m is an integer representing the number of the plurality of expected data, which is equal to the number of the plurality of detection data. In Eq. (20), H is a matrix with m rows and two columns defined according to the patterns of the target magnetic field and the noise magnetic field Mex at the plurality of detection positions. In Eq. (20), x is a two-dimensional column vector containing the first unknown M and the second unknown E as its elements.

In the present embodiment, the first and second unknowns M and E are estimated by determining the column vector x. Here, let y represent an m-dimensional column vector containing m number of elements having correspondences with the plurality of detection data. The column vector x is determined so as to minimize the sum of squares of differences between respective corresponding ones of the m number of elements of the column vector y and the m number of elements of the column vector z. In the concrete, this is accomplished by defining a least squares cost function for determining the column vector x, and obtaining the column vector x that minimizes the value of the function. The column vector x for estimating the first and second unknowns M and E is expressed in Eq. (21) below.

$$x = (H^T H)^{-1} H^T y \quad (21)$$

The processor 350 determines the detection value θs based on the first unknown M, which is one of the two elements of the column vector x computed from Eq. (21).

Figure 17:
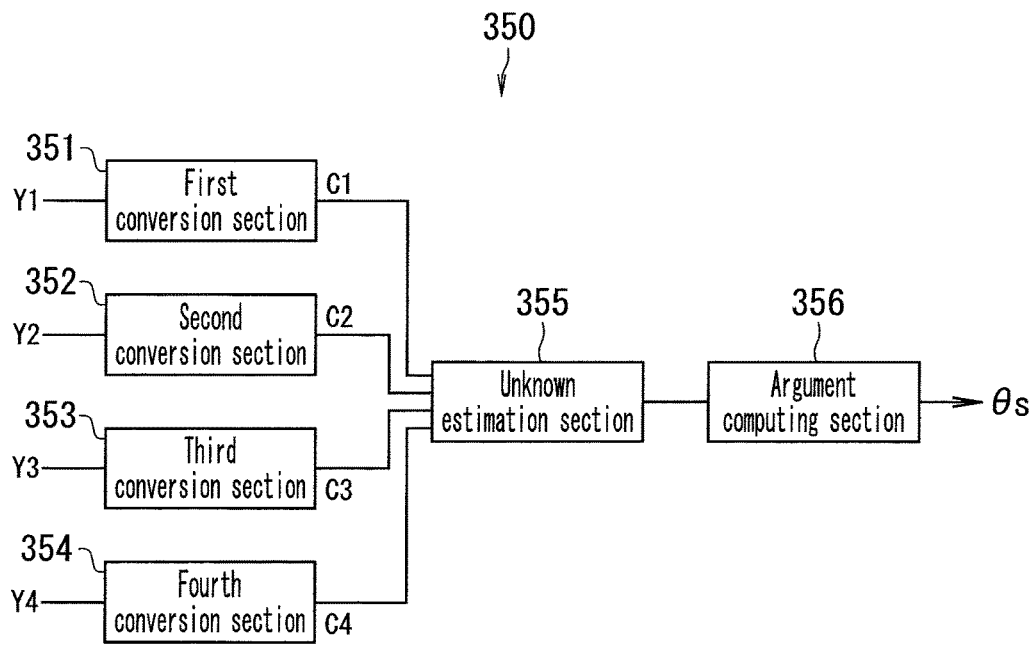
FIG. 17 is a functional block diagram illustrating an example configuration of a processor of the fourth embodiment of the invention.

Reference is now made to FIG. 17 to specifically describe the configuration of the processor 350 and the generation method for the detection value θs. The processor 350 performs arithmetic processing using complex numbers, for example. FIG. 17 is a block diagram showing an example configuration of the processor 350. In this example, the processor 350 includes a first conversion section 351, a second conversion section 352, a third conversion section 353, a fourth conversion section 354, an unknown estimation section 355, and an argument computing section 356.

The first conversion section 351 converts the vector Y1, i.e., the first detection data, into a complex number C1. The real part Re1 and the imaginary part Im1 of the complex number C1 are expressed in Eqs. (22A) and (22B) below, respectively.

$$Re1 = Ma1 \cdot \cos \theta 1s \quad (22A)$$

$$Im1 = Ma1 \cdot \sin \theta 1s \quad (22B)$$

The second conversion section 352 converts the vector Y2, i.e., the second detection data, into a complex number C2. The real part Re2 and the imaginary part Im2 of the complex number C2 are expressed in Eqs. (23A) and (23B) below, respectively.

$$Re2 = Ma2 \cdot \cos \theta 2s \quad (23A)$$

$$Im2 = Ma2 \cdot \sin \theta 2s \quad (23B)$$

The third conversion section 353 converts the vector Y3, i.e., the third detection data, into a complex number C3. The real part Re3 and the imaginary part Im3 of the complex number C3 are expressed in Eqs. (24A) and (24B) below, respectively.

$$Re3 = Ma3 \cdot \cos \theta 3s \quad (24A)$$

$$Im3 = Ma3 \cdot \sin \theta 3s \quad (24B)$$

The fourth conversion section 354 converts the vector Y4, i.e., the fourth detection data, into a complex number C4. The real part Re4 and the imaginary part Im4 of the complex number C4 are expressed in Eqs. (25A) and (25B) below, respectively.

$$Re4 = Ma4 \cdot \cos \theta 4s \quad (25A)$$

$$Im4 = Ma4 \cdot \sin \theta 4s \quad (25B)$$

The unknown estimation section 355 estimates the first and second unknowns M and E using the complex numbers C1 to C4 having correspondences with the vectors Y1 to Y4, respectively. Here, let $z_1$, $z_2$, $z_3$, and $z_4$ represent first, second, third, and fourth expected data which are expected based on the first to fourth detection data, respectively. In the present embodiment, the first to fourth expected data $z_1$ to $z_4$ are modeled by Eq. (26) below.

$$\begin{bmatrix} z_1 \\ z_2 \\ z_3 \\ z_4 \end{bmatrix} = \begin{bmatrix} \frac{1}{(r_1)^3} & 1 \\ \frac{1}{(r_2)^3} & 1 \\ \frac{1}{(r_3)^3} & 1 \\ \frac{1}{(r_4)^3} & 1 \end{bmatrix} \begin{bmatrix} M \\ E \end{bmatrix} \qquad (26)$$

The four-dimensional column vector on the left side of Eq. (26) corresponds to z of Eq. (20).

The matrix with four rows and two columns on the right side of Eq. (26) corresponds to H of Eq. (20). This matrix is hereinafter represented by $H_e$. The four elements of the first column of the matrix $H_e$ are defined according to the patterns of the target magnetic field at the first to fourth detection positions P1 to P4, in other words, the patterns of the first to fourth partial magnetic fields MFa to MFd. In the present embodiment, the four elements of the first column of the matrix $H_e$ are defined on the assumption that the first to fourth partial magnetic fields MFa to MFd are in the same direction and the strength of the target magnetic field decreases in inverse proportion to the third power of the distance between the magnet 6 and the detection position. More specifically, as represented by Eq. (26), the four elements of the first column of the matrix $H_e$ are defined using $r_1$, $r_2$, $r_3$, and $r_4$. Each of $r_1$, $r_2$, $r_3$ and $r_4$ is the ratio of the distance between the magnet 6 and the detection position P1, P2, P3 or P4 to the distance between the magnet 6 and the foregoing predetermined position.

The four elements of the second column of the matrix $H_e$ are defined according to the patterns of the noise magnetic field Mex at the first to fourth detection positions P1 to P4. In the present embodiment, the four elements of the second column of the matrix $H_e$ are defined on the assumption that the noise magnetic field Mex is in the same direction at the first to fourth detection positions P1 to P4 and has the same strength at the first to fourth detection positions P1 to P4. More specifically, as represented by Eq. (26), all of the four elements of the second column of the matrix $H_e$ are set at 1.

The two-dimensional column vector on the right side of Eq. (26) corresponds to x of Eq. (20). This column vector is hereinafter represented by $x_e$. The column vector $x_e$ contains the first unknown M and the second unknown E as its elements. In the present embodiment, both of the first and second unknowns M and E are complex numbers. The argument of the first unknown M represents direction information corresponding to the detection value θs. The absolute value of the first unknown M represents magnitude information corresponding to the strength of the target magnetic field at the predetermined position. In the present embodiment, the predetermined position is the first detection position P1. The argument of the second unknown E represents direction information corresponding to the direction of the noise magnetic field Mex. The absolute value of the second unknown E represents magnitude information corresponding to the strength of the noise magnetic field Mex.

The unknown estimation section 355 determines the column vector $x_e$ based on Eq. (21). Here, let $y_e$ represent a four-dimensional column vector containing the complex numbers C1 to C4 as its elements. The column vector $y_e$ is expressed in Eq. (27) below.

$$y_e^T = [C1, C2, C3, C4] \qquad (27)$$

The unknown estimation section 355 computes $x_e$ by replacing H, x, and y in Eq. (27) with $H_e$, $x_e$, and $y_e$, respectively. The first unknown M and the second unknown E are thereby estimated.

The argument computing section 356 determines the detection value θs based on the first unknown M estimated by the unknown estimation section 355. In the present embodiment, the argument of the first unknown M is used as the detection value θs. The argument computing section 356 thus obtains the argument of the first unknown M to compute the detection value θs. To be more specific, the argument computing section 356 computes θs in accordance with Eq. (28) below, using the real part $Re_M$ and the imaginary part $Im_M$ of the first unknown M, for example.

$$\theta s = \operatorname{atan}(Im_M / Re_M) \qquad (28)$$

For θs ranging from 0° to less than 360°, Eq. (28) yields two solutions of θs that are 180° different in value. Which of the two solutions of θs in Eq. (28) is the true value of θs can be determined in accordance with the combination of the signs of $Re_M$ and $Im_M$. The argument computing section 356 determines θs within the range of 0° to less than 360° in accordance with Eq. (28) and the determination on the combination of the signs of $Re_M$ and $Im_M$.

θ1s, which indicates the first angle θ1, corresponds to a detection value θs that is generated based on only the first detection data. θ2s, which indicates the second angle θ2, corresponds to a detection value θs that is generated based on only the second detection data. θ3s, which indicates the third angle θ3, corresponds to a detection value θs that is generated based on only the third detection data. θ4s, which indicates the fourth angle θ4, corresponds to a detection value θs that is generated based on only the fourth detection data. As has been described in relation to the first embodiment, θ1s and θ2s each contain an error caused by the noise magnetic field Mex. Similarly, θ3s and θ4s each contain an error caused by the noise magnetic field Mex.

In contrast, according to the present embodiment, the detection value θs is generated using a least squares method based on the first to fourth detection data generated by the first to fourth magnetic sensors 10A, 20A, 30A and 40A. The first to fourth detection positions P1 to P4 are different from each other. This causes the noise magnetic field Mex to have different relative effects on the first to fourth detection data. This may result in differences dependent on the noise magnetic field Mex between the first to fourth detection data. In the present embodiment, in particular, the relative effect of the noise magnetic field Mex increases with increasing distance between the magnet 6 and the detection positions.

By using the above-described characteristic, it is possible to estimate an ideal target magnetic field (hereinafter referred to as an ideal magnetic field) at a predetermined position and the noise magnetic field Mex. The ideal magnetic field is such a hypothetical magnetic field that the angle formed by the direction of the ideal magnetic field with respect to the reference direction DR corresponds to a true angle of interest θ that the angle sensor 1 is to detect.

In the present embodiment, the first unknown M estimated by the unknown estimation section 355 corresponds to an estimated ideal magnetic field, and the second unknown E estimated by the unknown estimation section 355 corresponds to an estimated noise magnetic field Mex. In the present embodiment, the detection value θs is determined based on the first unknown M. The present embodiment thus enables estimation of the detection value θs unaffected by the noise magnetic field Mex. In other words, the present embodiment enables generation of the detection value θs with reduced error caused by the noise magnetic field Mex as compared to θ1s to θ4s.

In the present embodiment, the clock generator to generate the sampling clock CLK for determining the sampling time of the first to eighth ADCs 13, 14, 23, 24, 33, 34, 43 and 44 may be constructed separately form the electronic components 10, 20, 30 and 40, as in the second embodiment.

The configuration, function and effects of the present embodiment are otherwise the same as those of any of the first to third embodiments.

Fifth Embodiment

A fifth embodiment of the present invention will now be described. First, a sensor system 400 of the present embodiment will be described with reference to FIG. 18. The sensor system 400 includes an angle sensor 401 according to the present embodiment, and a physical information generator 405. The angle sensor 401 is specifically a magnetic angle sensor. The angle sensor 401 detects a target magnetic field as physical information, the target magnetic field being a magnetic field whose direction varies depending on the angle of interest θ, and generates a detection value having a correspondence with the angle of interest θ.

Figure 18:
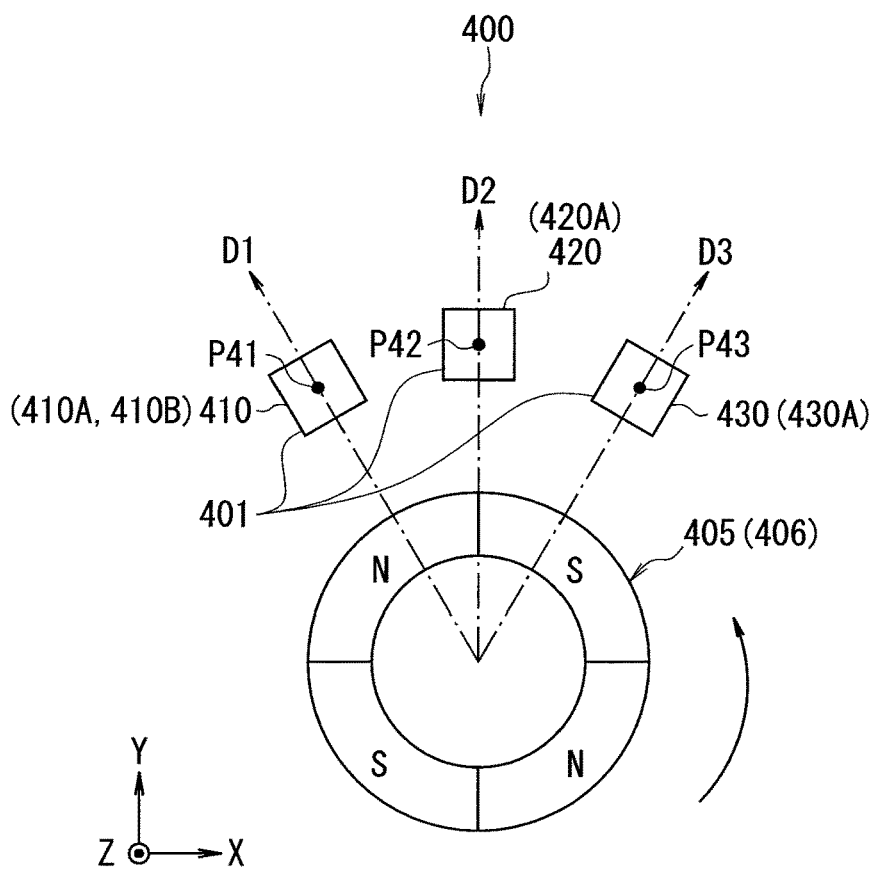
FIG. 18 is an explanatory diagram showing a schematic configuration of a sensor system of a fifth embodiment of the invention.

The physical information generator 405 of the present embodiment is a magnetic field generator that generates the target magnetic field as the physical information. FIG. 18 shows a magnet 406 including one or more pairs of N and S poles arranged alternately in an annular shape. In the example shown in FIG. 18, the magnet 406 includes two pairs of N and S poles. The angle sensor 401 detects the direction of the target magnetic field generated from the outer circumference of the magnet 406. In the example shown in FIG. 18, the plane of the drawing of FIG. 18 is an XY plane, and a direction perpendicular to the plane of the drawing is the Z direction. The N and S poles of the magnet 406 are arranged symmetrically with respect to the center of rotation parallel to the Z direction. The magnet 406 rotates around the center of rotation. The target magnetic field thus rotates around the center of rotation (the Z direction).

In the present embodiment, the angle of interest θ is an angle that indicates the direction of the target magnetic field at a predetermined reference position. The detection value is a value indicating the direction of the target magnetic field at the reference position. The angle sensor 401 includes a plurality of magnetic sensors each of which generates detection data having a correspondence with the angle of interest θ. In the present embodiment, a common reference plane is defined for the plurality of magnetic sensors. The reference plane is an imaginary plane perpendicular to the Z direction.

The reference position lies in the reference plane. In the reference plane, the direction of the target magnetic field generated by the magnet 406 rotates around the reference position. In the following description, the direction of the target magnetic field at the reference position refers to a direction in the reference plane.

In the present embodiment, a reference direction is defined which serves as a basis for expressing the direction of the target magnetic field. The reference direction lies in the reference plane and intersects the reference position. In the example shown in FIG. 18, the magnet 406 rotates counterclockwise, and the direction of the target magnetic field rotates clockwise. The angle that the direction of the target magnetic field at the reference position forms with respect to the reference direction is expressed as positive values when viewed clockwise from the reference direction, and as negative values when viewed counterclockwise from the reference direction.

In the present embodiment, the plurality of magnetic sensors are a first magnetic sensor 410A, a second magnetic sensor 420A, and a third magnetic sensor 430A. The angle sensor 401 further includes three electronic components 410, 420 and 430. The first magnetic sensor 410A is included in the electronic component 410. The second magnetic sensor 420A is included in the electronic component 420. The third magnetic sensor 430A is included in the electronic component 430. The electronic components 410, 420 and 430 are arranged at positions different from each other in the direction of rotation of the magnet 406.

The first magnetic sensor 410A detects the target magnetic field at a first detection position P41 and generates first detection data. The second magnetic sensor 420A detects the target magnetic field at a second detection position P42 and generates second detection data. The third magnetic sensor 430A detects the target magnetic field at a third detection position P43 and generates third detection data. The first to third detection positions P41, P42 and P43 lie in the reference plane. The reference position is, for example, the second detection position P42.

Figure 19:
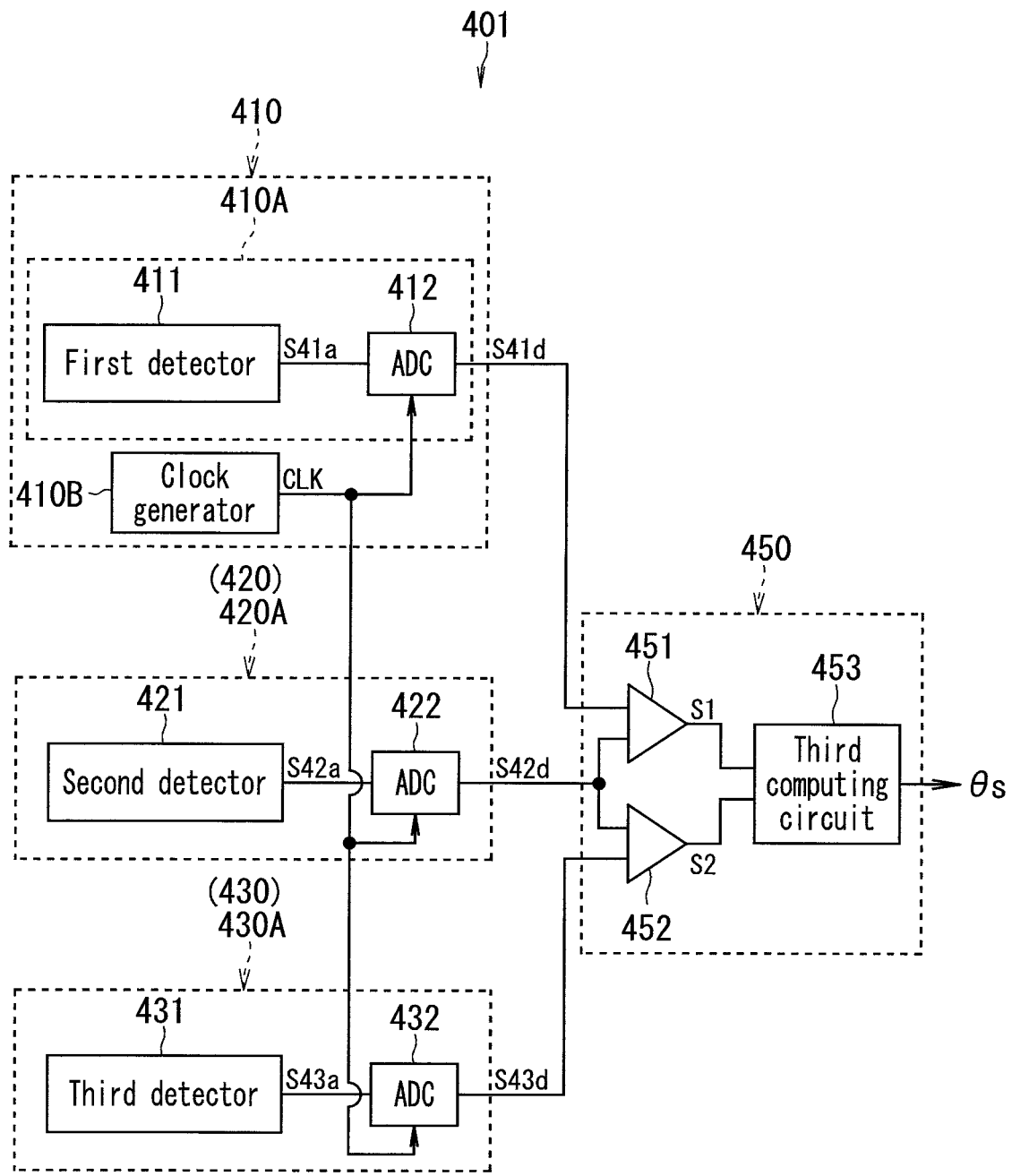
FIG. 19 is a functional block diagram showing the configuration of an angle sensor according to the fifth embodiment of the invention.

Next, the configuration of the angle sensor 401 will be described in detail with reference to FIG. 19. FIG. 19 is a functional block diagram showing the configuration of the angle sensor 401. The first magnetic sensor 410A includes a first detector 411. The second magnetic sensor 420A includes a second detector 421. The third magnetic sensor 430A includes a third detector 431. Each of the first to third detectors 411, 421 and 431 includes at least one magnetic detection element.

The first, the second, and the third detector 411, 421 and 431 respectively generate a first, a second, and a third analog detection signal S41a, S42a, and S43a each corresponding to the direction of the target magnetic field. To be more specific, the first detector 411 generates the first analog detection signal S41a corresponding to a relative angle between the direction of the target magnetic field and a first direction D1. The second detector 421 generates the second analog detection signal S42a corresponding to a relative angle between the direction of the target magnetic field and a second direction D2. The third detector 431 generates the third analog detection signal S43a corresponding to a relative angle between the direction of the target magnetic field and a third direction D3.

FIG. 18 shows the first to third directions D1 to D3. The first direction D1 is a radial direction of the magnet 406, and directed from the center of rotation of the magnet 406 to the first detection position P41. The second direction D2 is a radial direction of the magnet 406, and directed from the center of rotation of the magnet 406 to the second detection position P42. The third direction D3 is a radial direction of the magnet 406, and directed from the center of rotation of the magnet 406 to the third detection position P43.

Each of the first to third analog detection signals S41a, S42a and S43a contains an ideal component which varies periodically with a predetermined signal period in such a manner as to trace an ideal sinusoidal curve (including sine and cosine waveforms). The first to third magnetic sensors 410A, 420A and 430A are configured so that the respective ideal components of the first to third analog detection signals S41a, S42a and S43a have mutually different phases. The absolute value of a phase difference between the ideal component of the first analog detection signal S41a and the ideal component of the second analog detection signal S42a will be denoted by PH1. The absolute value of a phase difference between the ideal component of the second analog detection signal S42a and the ideal component of the third analog detection signal S43a will be denoted by PH2.

PH1 and PH2 are both 60°. The first to third detection positions P41, P42, and P43 are defined so that both PH1 and PH2 are 60°. Both a difference between the first and second detection positions P41 and P42 and a difference between the second and third detection positions P42 and P43 are 60° in electrical angle, i.e., 30° in rotational angle of the magnet 406. A difference between the first and third detection positions P41 and P43 is 120° in electrical angle, i.e., 60° in rotational angle of the magnet 406.

The first magnetic sensor 410A further includes a first ADC 412. The first ADC 412 converts the first analog detection signal S41a into a first digital detection signal S41d. The first digital detection signal S41d is the first detection data.

The second magnetic sensor 420A further includes a second ADC 422. The second ADC 422 converts the second analog detection signal S42a into a second digital detection signal S42d. The second digital detection signal S42d is the second detection data.

The third magnetic sensor 430A further includes a third ADC 432. The third ADC 432 converts the third analog detection signal S43a into a third digital detection signal S43d. The third digital detection signal S43d is the third detection data.

The angle sensor 401 further includes a clock generator 410B that generates a sampling clock CLK for determining the sampling time. The clock generator 410B is included in the electronic component 410. The first to third ADCs 412, 422 and 432 are all configured so that the sampling time is determined by the sampling clock CLK generated by the clock generator 410B. The clock generator 410B and the first to third ADCs 412, 422 and 432 are electrically connected via signal lines that transmit the sampling clock CLK.

The first to third ADCs 412, 422 and 432 are the same in configuration. The specific configuration of the first to third ADCs 412, 422 and 432 is the same as the configuration of the first to fourth ADCs 13, 14, 23 and 24 of the first embodiment.

The angle sensor 401 further includes a processor 450 that generates a detection value θs by performing arithmetic processing using the first to third detection data, i.e., the first to third digital detection signals S41d, S42d and S43d. The processor 450 can be implemented by an ASIC or microcomputer, for example. A method for generating the detection value θs will be described later.

The configuration of the first to third detectors 411, 421 and 431 will now be described. The first to third detectors 411, 421 and 431 each have the same configuration as the first detector 11 of the first embodiment. Thus, in the following description, components of the first to third detectors 411, 421 and 431 are denoted by the same reference signs as those used for the components of the first detector 11 of the first embodiment shown in FIG. 4.

In the first detector 411, the magnetization pinned layers of the MR elements included in the magnetic detection elements R11 and R14 are magnetized in the first direction D1, and the magnetization pinned layers of the MR elements included in the magnetic detection elements R12 and R13 are magnetized in the opposite direction to the first direction D1. In this case, the potential difference between the output ports E11 and E12 varies depending on the relative angle between the direction of the target magnetic field and the first direction D1. The difference detector 18 outputs a signal corresponding to the potential difference between the output ports E11 and E12 as the first analog detection signal S41a.

In the second detector 421, the magnetization pinned layers of the MR elements included in the magnetic detection elements R11 and R14 are magnetized in the second direction D2, and the magnetization pinned layers of the MR elements included in the magnetic detection elements R12 and R13 are magnetized in the opposite direction to the second direction D2. In this case, the potential difference between the output ports E11 and E12 varies depending on the relative angle between the direction of the target magnetic field and the second direction D2. The difference detector 18 outputs a signal corresponding to the potential difference between the output ports E1 and E12 as the second analog detection signal S42a.

In the third detector 431, the magnetization pinned layers of the MR elements included in the magnetic detection elements R11 and R14 are magnetized in the third direction D3, and the magnetization pinned layers of the MR elements included in the magnetic detection elements R12 and R13 are magnetized in the opposite direction to the third direction D3. In this case, the potential difference between the output ports E11 and E12 varies depending on the relative angle between the direction of the target magnetic field and the third direction D3. The difference detector 18 outputs a signal corresponding to the potential difference between the output ports E11 and E12 as the third analog detection signal S43a.

In the light of the production accuracy of the MR elements and other factors, the magnetization directions of the magnetization pinned layers of the plurality of MR elements in the detectors 411, 421 and 431 may be slightly different from the above-described directions.

Next, the configuration of the processor 450 will be described with reference to FIG. 19. The processor 450 includes a first computing circuit 451, a second computing circuit 452, and a third computing circuit 453.

The first computing circuit 451 receives the first and second digital detection signals S41d and S42d and generates a first processed signal S1, which is the sum of the first and second digital detection signals S41d and S42d. The second computing circuit 452 receives the second and third digital detection signals S42d and S43d and generates a second processed signal S2, which is the sum of the second and third digital detection signals S42d and S43d. The third computing circuit 453 receives the first and second processed signals S1 and S2 and computes the detection value θs based on the first and second processed signals S1 and S2.

A method for computing the detection value θs will be described below. To begin with, a method for generating the first and second processed signals S1 and S2 will be described. The first and second processed signals S1 and S2 are generated based on the first to third digital detection signals S41d to S43d. Ideally, the first to third analog detection signals S41a to S43a should contain only the foregoing ideal components, and the waveforms of the first to third analog detection signals S41a to S43a should trace a sinusoidal curve. In actuality, however, the waveforms of the first to third analog detection signals S41a to S43a are distorted from a sinusoidal curve due to the MR elements. An example of the situations where the waveforms of the first to third analog detection signals S41a to S43a are distorted due to the MR elements is where the magnetization directions of the magnetization pinned layers vary under the influence of the target magnetic field or like factors. This is likely to occur if the target magnetic field is relatively high in strength. Another example of the situations where the waveforms of the first to third analog detection signals S41a to S43a are distorted due to the MR elements is where the magnetization directions of the free layers differ from the direction of the target magnetic field because of shape anisotropy, coercivity, or the like of the free layers. This is likely to occur if the target magnetic field is relatively low in strength.

The distorted, non-sinusoidal first to third analog detection signals S41a to S43a contain error components aside from the ideal components. The error components are predominantly composed of components corresponding to harmonics having a period ⅓ the signal period. The first to third analog detection signals S41a to S43a thus each contain an error component corresponding to a harmonic having a period ⅓ the signal period.

The first to third digital detection signals S41d to 43d contain ideal components corresponding to those of the analog detection signals and error components corresponding to those of the analog detection signals. As mentioned previously, PH1 and PH2 are both 60° ($\pi/3$). The ideal components of the first, second, and third digital detection signals S41d, S42d, and S43d will thus be expressed as $\cos(\theta - \pi/3)$, $\cos\theta$, and $\cos(\theta + \pi/3)$, respectively.

The error components of the first, second, and third digital detection signals S41d, S42d, and S43d can be expressed as p·cos {3($\theta-\pi/3$)}, p·cos 3$\theta$, and p·cos {3($\theta+\pi/3$)}, respectively. Both the error components of the first and third digital detection signals S41d and S43d can be transformed into −p·cos 3$\theta$. Note that p is the amplitude of each of the error components of the first to third digital detection signals S41d, S42d and S43d, and is any value that satisfies 0<|p|<1.

By computing the sum of the first and second digital detection signals S41d and S42d to generate the first processed signal S1, the error component of the first digital detection signal S41d, i.e., −p·cos 3$\theta$, and the error component of the second digital detection signal S42d, i.e., p·cos 3$\theta$, completely cancel each other out to cause the first processed signal S1 to contain a zero error component.

By computing the sum of the second and third digital detection signals S42d and S43d to generate the second processed signal S2, the error component of the second digital detection signal S42d, i.e., p·cos 3$\theta$, and the error component of the third digital detection signal S43d, i.e., −p·cos 3$\theta$, completely cancel each other out to cause the second processed signal S2 to contain a zero error component.

Figure 20:
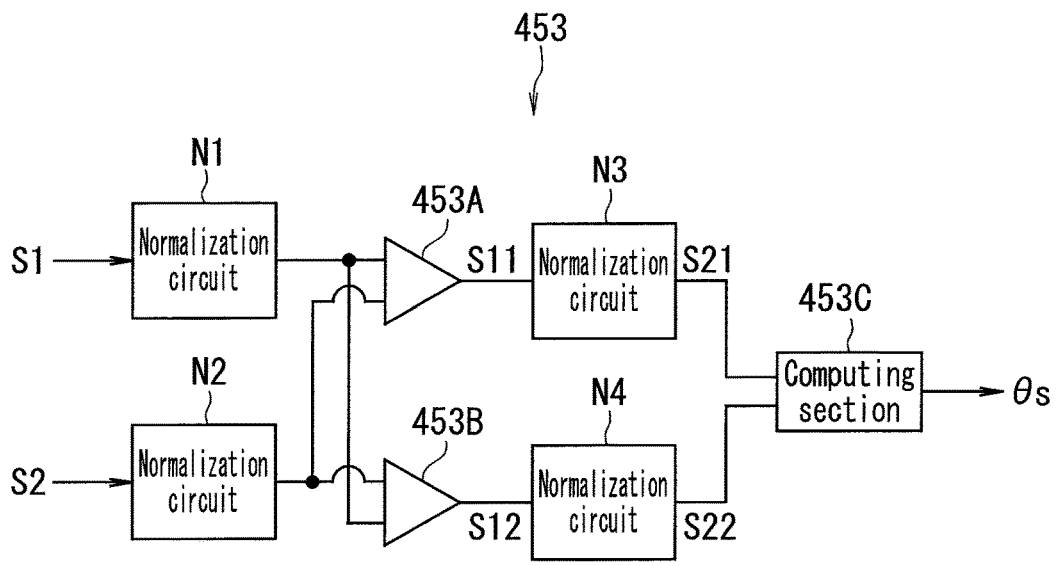
FIG. 20 is a functional block diagram showing the configuration of a third computing circuit of the fifth embodiment of the invention.

Reference is now made to FIG. 20 to describe the configuration of the third computing circuit 453 and a method by which the third computing circuit 453 computes the detection value θs. FIG. 20 is a block diagram showing the configuration of the third computing circuit 453. The third computing circuit 453 includes normalization circuits N1, N2, N3 and N4, an adder circuit 453A, a subtractor circuit 453B, and a computing section 453C.

The normalization circuit N1 outputs a normalized value of the first processed signal S1 to the adder circuit 453A and the subtractor circuit 453B. The normalization circuit N2 outputs a normalized value of the second processed signal S2 to the adder circuit 453A and the subtractor circuit 453B. The normalization circuits N1 and N2 normalize the processed signals S1 and S2, respectively, so that both the processed signals S1 and S2 have a maximum value of 1 and a minimum value of −1.

The adder circuit 453A adds the output value of the normalization circuit N1 and the output value of the normalization value N2 to generate an addition signal S11. The subtractor circuit 453B subtracts the output value of the normalization circuit N2 from the output value of the normalization circuit N1 to generate a subtraction signal S12.

The normalization circuit N3 outputs a normalized value S21 of the addition signal S11 to the computing section 453C. The normalization circuit N4 outputs a normalized value S22 of the subtraction signal S12 to the computing section 453C. The normalization circuits N3 and N4 normalize the signals S11 and S12, respectively, so that both the signals S11 and S12 have a maximum value of 1 and a minimum value of −1.

Based on the values S21 and S22, the computing section 453C computes the detection value θs having a correspondence with the angle of interest θ. Specifically, for example, the computing section 453C computes θs in accordance with Eq. (29) below. In Eq. (29), a is a constant determined by the reference position and reference direction.

$$\theta s = \operatorname{atan}(S22/S21) + \alpha \qquad (29)$$

For θs ranging from 0° to less than 360°, Eq. (29) yields two solutions of a tan(S22/S21) that are 180° different in value. Which of the two solutions of a tan(S22/S21) in Eq. (29) is the true value of a tan(S22/S21) can be determined in accordance with the combination of the signs of S21 and S22. The computing section 453C determines θs within the range of 0° to less than 360° in accordance with Eq. (29) and the determination on the combination of the signs of S21 and S22.

As has been described, in the present embodiment, the error component of the first digital detection signal S41d and the error component of the second digital detection signal S42d cancel each other out when the first processed signal S1 is generated, and the error component of the second digital detection signal S42d and the error component of the third digital detection signal S43d cancel each other out when the second processed signal S2 is generated. Then, the detection value θs is computed based on the first and second processed signals S1 and S2. The first and second processed signals S1 and S2 each theoretically contain a zero error component. The present embodiment thus enables generation of the detection value θs with reduced error resulting from the error components.

In the present embodiment, the clock generator to generate the sampling clock CLK for determining the sampling time of the first to third ADCs 412, 422 and 432 may be constructed separately form the electronic components 410, 420 and 430, as in the second embodiment.

The configuration, function and effects of the present embodiment are otherwise the same as those of the first or second embodiment.

Sixth Embodiment

Figure 21:
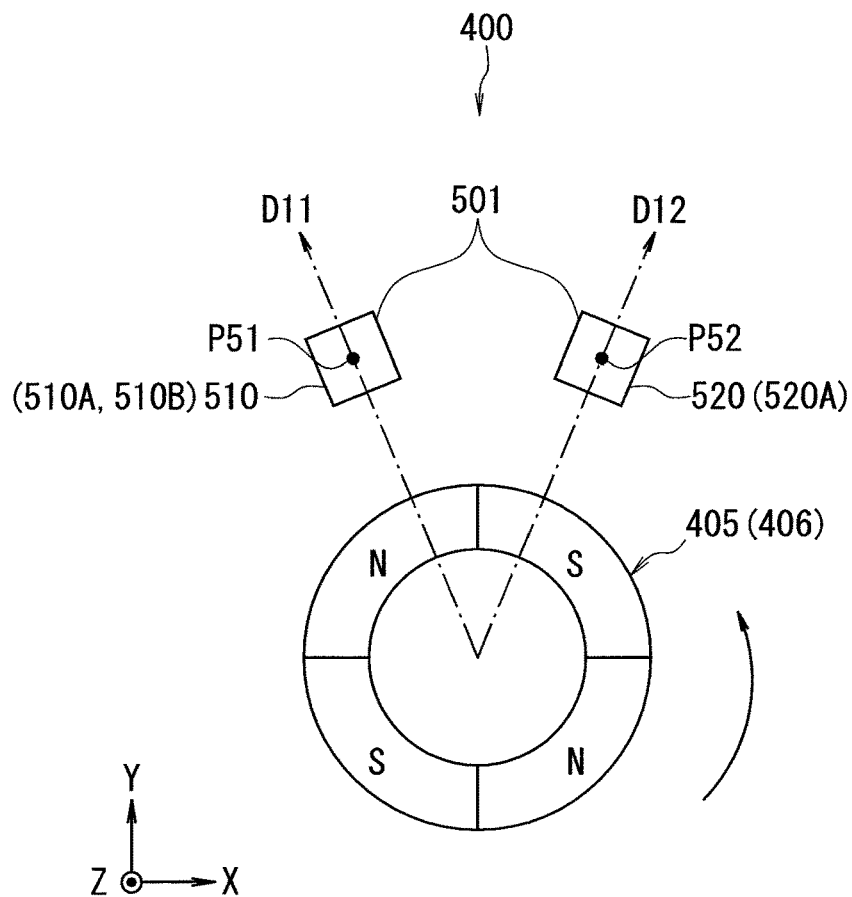
FIG. 21 is an explanatory diagram showing a schematic configuration of a sensor system of a sixth embodiment of the invention.
Figure 22:
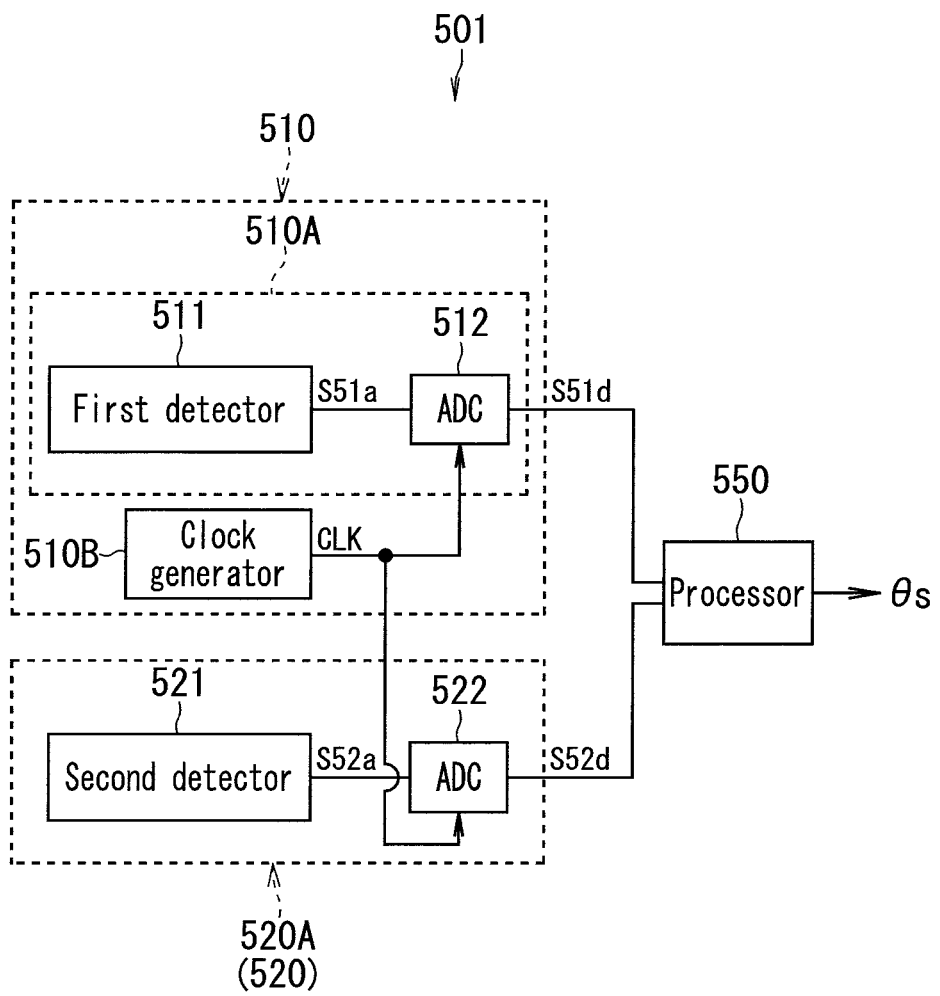
FIG. 22 is a functional block diagram showing the configuration of an angle sensor according to the sixth embodiment of the invention.

A sixth embodiment of the present invention will now be described with reference to FIG. 21 and FIG. 22. FIG. 21 is an explanatory diagram showing a schematic configuration of a sensor system including an angle sensor according to the present embodiment. FIG. 22 is a functional block diagram showing the configuration of the angle sensor according to the present embodiment. The sensor system 400 of the present embodiment includes an angle sensor 501 according to the present embodiment, instead of the angle sensor 401 according to the fifth embodiment. The angle sensor 501 is specifically a magnetic angle sensor. The angle sensor 501 detects a target magnetic field as physical information, the target magnetic field being a magnetic field whose direction varies depending on the angle of interest θ, and generates a detection value having a correspondence with the angle of interest θ. The angle sensor 501 detects the direction of the target magnetic field generated from the outer circumference of the magnet 406. The angle sensor 501 includes a first magnetic sensor 510A and a second magnetic sensor 520A each of which generates detection data having a correspondence with the angle of interest θ.

The angle sensor 501 further includes two electronic components 510 and 520. The first magnetic sensor 510A is included in the electronic component 510. The second magnetic sensor 520A is included in the electronic component 520. The electronic components 510 and 520 are arranged at positions different from each other in the direction of rotation of the magnet 406.

The first magnetic sensor 510A detects the target magnetic field at a first detection position P51 and generates first detection data. The second magnetic sensor 520A detects the target magnetic field at a second detection position P52 and generates second detection data. In the present embodiment, a reference plane and a reference position are defined as in the fifth embodiment. In the present embodiment, specifically, a common reference plane is defined for the first and second magnetic sensors 510A and 520A. The reference plane is an imaginary plane perpendicular to the Z direction. The first and second detection positions P51 and P52 lie in the reference plane. The reference position is the first detection position P51, for example.

As has been described in relation to the fifth embodiment, the angle of interest θ is an angle that indicates the direction of the target magnetic field at a predetermined reference position. The detection value is a value indicating the direction of the target magnetic field at the reference position. Further, a reference direction is defined which serves as a basis for expressing the direction of the target magnetic field. The reference direction lies in the reference plane and intersects the reference position. In the example shown in FIG. 21, the magnet 406 rotates counterclockwise, and the direction of the target magnetic field rotates clockwise. The angle that the direction of the target magnetic field at the reference position forms with respect to the reference direction is expressed as positive values when viewed clockwise from the reference direction, and as negative values when viewed counterclockwise from the reference direction.

The first magnetic sensor 510A includes a first detector 511. The second magnetic sensor 520A includes a second detector 521. Each of the first and second detectors 511 and 521 includes at least one magnetic detection element.

The first detector 511 generates a first analog detection signal S51a corresponding to the direction of the target magnetic field. To be more specific, the first detector 511 generates the first analog detection signal S51a corresponding to a relative angle between the direction of the target magnetic field and a first direction D11. The second detector 521 generates a second analog detection signal S52a corresponding to the direction of the target magnetic field. To be more specific, the second detector 521 generates the second analog detection signal S52a corresponding to a relative angle between the direction of the target magnetic field and a second direction D12.

FIG. 21 shows the first and second directions D11 and D12. The first direction D11 is a radial direction of the magnet 406, and directed from the center of rotation of the magnet 406 to the first detection position P51. The second direction D12 is a radial direction of the magnet 406, and directed from the center of rotation of the magnet 406 to the second detection position P52.

The first and second magnetic sensors 510A and 520A are configured so that the first and second analog detection signals S51a and S52a have mutually different phases. The difference between the first detection position P51 and the second detection position P52 corresponds to a phase difference between the first analog detection signal S51a and the second analog detection signal S52a. The phase difference is 90°. The first and second detection positions P51 and P52 are defined so that the phase difference is 90°. The difference between the first and second detection positions P51 and P52 is 90° in electrical angle, i.e., 45° in rotational angle of the magnet 406.

The first magnetic sensor 510A further includes a first ADC 512. The first ADC 512 converts the first analog detection signal S51a into a first digital detection signal S51d. The first digital detection signal S5.1d is the first detection data.

The second magnetic sensor 520A further includes a second ADC 522. The second ADC 522 converts the second analog detection signal S52a into a second digital detection signal S52d. The second digital detection signal S52d is the second detection data.

The angle sensor 501 further includes a clock generator 510B that generates a sampling clock CLK for determining the sampling time. The clock generator 510B is included in the electronic component 510. The first and second ADCs 512 and 522 are both configured so that the sampling time is determined by the sampling clock CLK generated by the clock generator 410B. The clock generator 510B and the first and second ADCs 512 and 522 are electrically connected via signal lines that transmit the sampling clock CLK.

The first and second ADCs 512 and 522 are the same in configuration. The specific configuration of the first and second ADCs 512 and 522 is the same as the configuration of the first to fourth ADCs 13, 14, 23 and 24 of the first embodiment.

The angle sensor 501 further includes a processor 550 that generates a detection value θs by performing arithmetic processing using the first and second detection data, i.e., the first and second digital detection signals S51d and S52d. The processor 550 can be implemented by an ASIC or microcomputer, for example. A method for generating the detection value θs will be described later.

The configuration of the first and second detectors 511 and 521 will now be described. The first and second detectors 511 and 521 each have the same configuration as the first detector 11 of the first embodiment. Thus, in the following description, components of the first and second detectors 511 and 521 are denoted by the same reference signs as those used for the components of the first detector 11 of the first embodiment shown in FIG. 4.

In the first detector 511, the magnetization pinned layers of the MR elements included in the magnetic detection elements R11 and R14 are magnetized in the first direction D11, and the magnetization pinned layers of the MR elements included in the magnetic detection elements R12 and R13 are magnetized in the opposite direction to the first direction D11. In this case, the potential difference between the output ports E11 and E12 varies depending on the relative angle between the direction of the target magnetic field and the first direction D11. The difference detector 18 of the first detector 511 outputs a signal corresponding to the potential difference between the output ports E11 and E12 as the first analog detection signal S51a.

In the second detector 521, the magnetization pinned layers of the MR elements included in the magnetic detection elements R11 and R14 are magnetized in the second direction D12, and the magnetization pinned layers of the MR elements included in the magnetic detection elements R12 and R13 are magnetized in the opposite direction to the second direction D12. In this case, the potential difference between the output ports E11 and E12 varies depending on the relative angle between the direction of the target magnetic field and the second direction D12. The difference detector 18 of the second detector 521 outputs a signal corresponding to the potential difference between the output ports E11 and E12 as the second analog detection signal S52a.

In the light of the production accuracy of the MR elements and other factors, the magnetization directions of the magnetization pinned layers of the plurality of MR elements in the detectors 511 and 521 may be slightly different from the above-described directions.

Next, a method for computing the detection value θs will be described. The processor 550 performs arithmetic processing using the first and second detection data, i.e., the first and second digital detection signals S51d and S52d, thereby computing the detection value θs having a correspondence with the angle of interest θ. Specifically, for example, the processor 550 computes θs in accordance with Eq. (30) below. In Eq. (30), (is a constant determined by the reference position and reference direction.

$$\theta s = \mathrm{atan}(S51d/S52d) + \beta \quad (30)$$

For θs ranging from 0° to less than 360°, Eq. (30) yields two solutions of a tan(S5.1d/S52d) that are 180° different in value. Which of the two solutions of a tan(S51d/S52d) in Eq. (30) is the true value of a tan(S51d/S52d) can be determined in accordance with the combination of the signs of S51d and S52d. The processor 550 determines θs within the range of 0° to less than 360° in accordance with Eq. (30) and the determination on the combination of the signs of S51d and S52d.

In the present embodiment, the clock generator to generate the sampling clock CLK for determining the sampling time of the first and second ADCs 512 and 522 may be constructed separately from the electronic components 510 and 520, as in the second embodiment.

The configuration, function and effects of the present embodiment are otherwise the same as those of the fifth embodiment.

The present invention is not limited to the foregoing embodiments, and various modifications may be made thereto. For example, as long as the requirements of the appended claims are met, the number and layout of the magnetic sensors and the configurations of the ADCs and clock generators are not limited to the respective examples illustrated in the foregoing embodiments but can be freely chosen.

Furthermore, the present invention is applicable not only to magnetic angle sensors but also to any detection devices that detect physical information varying depending on information to be detected and generate a detection value having a correspondence with the information to be detected, the detection devices including a plurality of sensors each of which generates detection data having a correspondence with the physical information and a processor that generates a detection value by performing arithmetic processing using a plurality of detection data generated by the plurality of sensors. Examples of the detection devices other than angle sensors include a position detection device that detects physical information varying depending on the position of an object and generates a detection value having a correspondence with the position of the object. The position detection device may include a plurality of distance sensors that each generate detection data having a correspondence with a distance to the object as the physical information, and a processor for generating the detection value. Each of the plurality of distance sensors includes at least one detector and at least one ADC. The detector may be one that uses laser light or one that uses ultrasonic waves. The position detection device is configured so that the ADCs of the plurality of distance sensors perform sampling at the same sampling time. The processor generates the detection value indicating the position of the object based on, for example, a plurality of detection data generated by the plurality of distance sensors. The plurality of distance sensors may be arranged in a non-coplanar positional relationship.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. An angle sensor configured to detect a target magnetic field whose direction varies depending on an angle to be detected, and to generate a detection value corresponding to the angle to be detected, the angle sensor comprising:
   a clock generator configured to generate a sampling clock for determining a sampling time;
   a plurality of magnetic sensors each configured to generate detection data corresponding to the angle to be detected each of the plurality of magnetic sensors including:
      a detector configured to detect the target magnetic field and generate an analog detection signal corresponding to the angle to be detected; and
      an analog-to-digital converter configured to sample the analog detection signal generated by the detector at the sampling time determined by the sampling clock, convert the sampled analog detection signal into a digital detection signal, and output the digital detection signal; and
   a processor configured to generate the detection value by performing arithmetic processing using a plurality of detection data generated by the plurality of magnetic sensors, wherein
   in each of the plurality of magnetic sensors, the detection data is based on the digital detection signal, and
   the sampling times of the analog-to-digital converters in the plurality of magnetic sensors are at a same time.

2. The angle sensor according to claim 1, further comprising a plurality of electronic components, wherein the plurality of magnetic sensors are respectively included in different ones of the plurality of electronic components.

3. The angle sensor according to claim 1, further comprising a plurality of electronic components, wherein
   the plurality of magnetic sensors are respectively included in different ones of the plurality of electronic components, and
   the clock generator is included in one of the plurality of electronic components.

4. The angle sensor according to claim 1, further comprising a plurality of electronic components, wherein
   the plurality of magnetic sensors are respectively included in different ones of the plurality of electronic components, and
   the clock generator is constructed separately from the plurality of electronic components.

5. The angle sensor according to claim 1, wherein for one of the analog-to-digital converters:
the analog-to-digital converter includes a sample-and-hold circuit that samples the analog detection signal and a quantization circuit that quantizes an output signal of the sample-and-hold circuit,
the sample-and-hold circuit is configured to alternate between a follow-up mode in which the output signal follows the analog detection signal and a holding mode in which the output signal is held at a constant value, and
the sampling time of the analog-to-digital converter is a time at which the sample-and-hold circuit switches from the follow-up mode to the holding mode.

6. The angle sensor according to claim 1, wherein for one of the analog-to-digital converters:
the analog-to-digital converter includes a quantization circuit that samples and quantizes the analog detection signal at the same time, and
the sampling time of the analog-to-digital converter is a time at which the quantization circuit samples and quantizes the analog detection signal.

7. The angle sensor according to claim 1, wherein the plurality of magnetic sensors are configured to detect the target magnetic field at mutually different detection positions.

8. The angle sensor according to claim 1, wherein
the plurality of magnetic sensors are configured to detect an applied magnetic field at mutually different detection positions, the applied magnetic field being a composite magnetic field of the target magnetic field and a noise magnetic field other than the target magnetic field, and
the processor is configured to generate the detection value by performing arithmetic processing using the plurality of detection data so that the detection value contains reduced error caused by the noise magnetic field compared to generating the detection value based on any single one of the plurality of detection data.

9. The angle sensor according to claim 8, wherein
the plurality of magnetic sensors are a first magnetic sensor and a second magnetic sensor,
the first magnetic sensor generates first detection data by detecting, at a first detection position, a first applied magnetic field including the target magnetic field,
the second magnetic sensor generates second detection data by detecting, at a second detection position, a second applied magnetic field including the target magnetic field, and
the target magnetic field has a first strength at the first detection position and a second strength at the second detection position, the first strength and the second strength being different from each other.

10. The angle sensor according to claim 9, wherein
the first detection data indicates a first angle that a direction of a first applied magnetic field component forms with respect to a reference direction, the first applied magnetic field component being a component of the first applied magnetic field and being parallel to a first reference plane,
the second detection data indicates a second angle that a direction of a second applied magnetic field component forms with respect to the reference direction, the second applied magnetic field component being a component of the second applied magnetic field and being parallel to a second reference plane, and the processor is configured to generate the detection value by performing arithmetic processing using the first and second angles and a ratio of the first strength to the second strength of the target magnetic field.

11. The angle sensor according to claim 10, wherein
the first magnetic sensor includes a first detector and a second detector as the detector, and a first analog-to-digital converter and a second analog-to-digital converter as the analog-to-digital converter,
the first detector generates a first analog detection signal corresponding to a cosine of the first angle,
the second detector generates a second analog detection signal corresponding to a sine of the first angle,
the first and second analog-to-digital converters convert the first and second analog detection signals into first and second digital detection signals, respectively,
the second magnetic sensor includes a third detector and a fourth detector as the detector, and a third analog-to-digital converter and a fourth analog-to-digital converter as the analog-to-digital converter,
the third detector generates a third analog detection signal corresponding to a cosine of the second angle,
the fourth detector generates a fourth analog detection signal corresponding to a sine of the second angle, and
the third and fourth analog-to-digital converters convert the third and fourth analog detection signals into third and fourth digital detection signals, respectively.

12. The angle sensor according to claim 11, wherein
the first magnetic sensor further includes a first data generator that generates the first detection data by performing arithmetic processing using the first and second digital detection signals, and
the second magnetic sensor further includes a second data generator that generates the second detection data by performing arithmetic processing using the third and fourth digital detection signals.

13. The angle sensor according to claim 9, wherein
the first magnetic sensor includes a first detector and a second detector as the detector, and a first analog-to-digital converter and a second analog-to-digital converter as the analog-to-digital converter,
the first and second detectors generate first and second analog detection signals indicating strengths of two components of the first applied magnetic field that are in mutually different directions,
the first and second analog-to-digital converters convert the first and second analog detection signals into first and second digital detection signals, respectively,
the second magnetic sensor includes a third detector and a fourth detector as the detector, and a third analog-to-digital converter and a fourth analog-to-digital converter as the analog-to-digital converter,
the third and fourth detectors generate third and fourth analog detection signals indicating strengths of two components of the second applied magnetic field that are in mutually different directions,
the third and fourth analog-to-digital converters convert the third and fourth analog detection signals into third and fourth digital detection signals, respectively,
the first detection data includes the first and second digital detection signals, and
the second detection data includes the third and fourth digital detection signals.

14. The angle sensor according to claim 8, wherein the arithmetic processing performed by the processor includes arithmetic processing using a least squares method.

15. The angle sensor according to claim 1, wherein
the analog detection signal contains an ideal component which varies in such a manner as to trace an ideal sinusoidal curve, and an error component corresponding to a harmonic of the ideal component, and
the plurality of magnetic sensors are configured so that the ideal components of the analog detection signals generated by the respective detectors of the plurality of magnetic sensors have mutually different phases.

16. The angle sensor according to claim 1, wherein the plurality of magnetic sensors are configured so that the analog detection signals generated by the respective detectors of the plurality of magnetic sensors have mutually different phases.

17. A detection device configured to detect physical information that varies depending on information to be detected, and to generate a detection value corresponding to the information to be detected, the detection device comprising:
a clock generator configured to generate a sampling clock for determining a sampling time;
a plurality of sensors each configured to generate detection data corresponding to the physical information, each of the plurality of sensors including:
a detector configured to detect the physical information and generate an analog detection signal corresponding to the information to be detected; and
an analog-to-digital converter configured to sample the analog detection signal generated by the detector at the sampling time determined by the sampling clock, convert the sampled analog detection signal into a digital detection signal, and output the digital detection signal; and
a processor configured to generate the detection value by performing arithmetic processing using a plurality of detection data generated by the plurality of sensors, wherein
in each of the plurality of sensors, the detection data is based on the digital detection signal, and
the sampling times of the analog-to-digital converters in the plurality of sensors are at a same time.

18. The detection device according to claim 17, further comprising a plurality of electronic components, wherein the plurality of sensors are respectively included in different ones of the plurality of electronic components.

19. The detection device according to claim 17, further comprising a plurality of electronic components, wherein
the plurality of sensors are respectively included in different ones of the plurality of electronic components, and
the clock generator is included in one of the plurality of electronic components.

20. The detection device according to claim 17, further comprising a plurality of electronic components, wherein
the plurality of sensors are respectively included in different ones of the plurality of electronic components, and
the clock generator is constructed separately from the plurality of electronic components.

21. The detection device according to claim 17, wherein for one of the analog-to-digital converters:
the analog-to-digital converter includes a sample-and-hold circuit that samples the analog detection signal and a quantization circuit that quantizes an output signal of the sample-and-hold circuit,
the sample-and-hold circuit is configured to alternate between a follow-up mode in which the output signal follows the analog detection signal and a holding mode in which the output signal is held at a constant value, and
the sampling time of the analog-to-digital converter is a time at which the sample-and-hold circuit switches from the follow-up mode to the holding mode.

22. The detection device according to claim 17, wherein for one of the analog-to-digital converters:
the analog-to-digital converter includes a quantization circuit that samples and quantizes the analog detection signal at the same time, and
the sampling time of the analog-to-digital converter is a time at which the quantization circuit samples and quantizes the analog detection signal.

23. An angle sensor configured to detect a target magnetic field whose direction varies depending on an angle to be detected, and to generate a detection value corresponding to the angle to be detected, the angle sensor comprising:
a plurality of magnetic sensors configured to generate detection data corresponding to the angle to be detected, and detect an applied magnetic field at mutually different detection positions, the applied magnetic field being a composite magnetic field of the target magnetic field and a noise magnetic field other than the target magnetic field, each of the plurality of magnetic sensors including:
a detector configured to detect the target magnetic field and generate an analog detection signal corresponding to the angle to be detected; and
an analog-to-digital converter configured to sample the analog detection signal generated by the detector, convert the sampled analog detection signal into a digital detection signal, and output the digital detection signal; and
a processor configured to generate the detection value by performing arithmetic processing using a plurality of detection data generated by the plurality of magnetic sensors so that the detection value contains reduced error caused by the noise magnetic field compared to generating the detection value based on any single one of the plurality of detection data, wherein
in each of the plurality of magnetic sensors, the detection data is based on the digital detection signal, and
sampling times of the analog-to-digital converters in the plurality of magnetic sensors are at a same time.

24. The angle sensor according to claim 23, wherein
the plurality of magnetic sensors are a first magnetic sensor and a second magnetic sensor,
the first magnetic sensor generates first detection data by detecting, at a first detection position, a first applied magnetic field including the target magnetic field,
the second magnetic sensor generates second detection data by detecting, at a second detection position, a second applied magnetic field including the target magnetic field, and
the target magnetic field has a first strength at the first detection position and a second strength at the second detection position, the first strength and the second strength being different from each other.

25. The angle sensor according to claim 24, wherein
the first detection data indicates a first angle that a direction of a first applied magnetic field component forms with respect to a reference direction, the first applied magnetic field component being a component of the first applied magnetic field and being parallel to a first reference plane, the second detection data indicates a second angle that a direction of a second applied magnetic field component forms with respect to the reference direction, the second applied magnetic field component being a component of the second applied magnetic field and being parallel to a second reference plane, and the processor generates the detection value by performing arithmetic processing using the first and second angles and a ratio of the first strength to the second strength of the target magnetic field.

26. The angle sensor according to claim 25, wherein the first magnetic sensor includes a first detector and a second detector as the detector, and a first analog-to-digital converter and a second analog-to-digital converter as the analog-to-digital converter, the first detector generates a first analog detection signal having a correspondence with a cosine of the first angle, the second detector generates a second analog detection signal having a correspondence with a sine of the first angle, the first and second analog-to-digital converters convert the first and second analog detection signals into first and second digital detection signals, respectively, the second magnetic sensor includes a third detector and a fourth detector as the detector, and a third analog-to-digital converter and a fourth analog-to-digital converter as the analog-to-digital converter, the third detector generates a third analog detection signal having a correspondence with a cosine of the second angle, the fourth detector generates a fourth analog detection signal having a correspondence with a sine of the second angle, and the third and fourth analog-to-digital converters convert the third and fourth analog detection signals into third and fourth digital detection signals, respectively.

27. The angle sensor according to claim 26, wherein the first magnetic sensor further includes a first data generator that generates the first detection data by performing arithmetic processing using the first and second digital detection signals, and the second magnetic sensor further includes a second data generator that generates the second detection data by performing arithmetic processing using the third and fourth digital detection signals.

28. The angle sensor according to claim 24, wherein the first magnetic sensor includes a first detector and a second detector as the detector, and a first analog-to-digital converter and a second analog-to-digital converter as the analog-to-digital converter, the first and second detectors generate first and second analog detection signals indicating strengths of two components of the first applied magnetic field that are in mutually different directions, the first and second analog-to-digital converters convert the first and second analog detection signals into first and second digital detection signals, respectively, the second magnetic sensor includes a third detector and a fourth detector as the detector, and a third analog-to-digital converter and a fourth analog-to-digital converter as the analog-to-digital converter, the third and fourth detectors generate third and fourth analog detection signals indicating strengths of two components of the second applied magnetic field that are in mutually different directions, the third and fourth analog-to-digital converters convert the third and fourth analog detection signals into third and fourth digital detection signals, respectively, the first detection data includes the first and second digital detection signals, and the second detection data includes the third and fourth digital detection signals.

29. The angle sensor according to claim 23, wherein the arithmetic processing performed by the processor includes arithmetic processing using a least squares method.

* * * * *